United States Patent
Yang et al.

(10) Patent No.: US 10,930,817 B2
(45) Date of Patent: Feb. 23, 2021

(54) LIGHT-EMITTING DEVICE

(71) Applicant: SAMSUNG ELECTRONICS CO., LTD., Suwon-si (KR)

(72) Inventors: Jong-in Yang, Hwaseong-si (KR); Dong-hyuk Joo, Suwon-si (KR); Jin-ha Kim, Yongin-si (KR); Joon-woo Jeon, Seoul (KR); Jung-hee Kwak, Daegu (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 158 days.

(21) Appl. No.: 15/385,942

(22) Filed: Dec. 21, 2016

(65) Prior Publication Data

US 2017/0263816 A1 Sep. 14, 2017

(30) Foreign Application Priority Data

Mar. 11, 2016 (KR) .................. 10-2016-0029665

(51) Int. Cl.
| | |
|---|---|
| *H01L 33/00* | (2010.01) |
| *H01L 33/14* | (2010.01) |
| *H01L 33/44* | (2010.01) |
| *H01L 33/06* | (2010.01) |
| *H01L 33/32* | (2010.01) |
| *H01L 33/42* | (2010.01) |
| *H01L 33/46* | (2010.01) |
| *H01L 33/52* | (2010.01) |

(Continued)

(52) U.S. Cl.
CPC ............ *H01L 33/145* (2013.01); *H01L 33/06* (2013.01); *H01L 33/32* (2013.01); *H01L 33/42* (2013.01); *H01L 33/44* (2013.01); *H01L 33/46* (2013.01); *H01L 33/52* (2013.01); *H01L 33/62* (2013.01); *H01L 33/38* (2013.01)

(58) Field of Classification Search
CPC ..... H01L 33/00–648; H01L 27/15–156; H01L 2933/00–0091; H01L 51/50–56; H01L 51/0032–0095; H01L 33/14–145; H01L 33/10; H01L 33/145; H01L 33/42; H01L 33/06; H01L 33/36–42; H01L 33/62; H01L 33/32; H01L 33/52; H01L 33/38–387
USPC .......................................................... 257/98
See application file for complete search history.

(56) References Cited

U.S. PATENT DOCUMENTS 5,317,587 A  5/1994  Ackley et al.
5,457,328 A * 10/1995  Ishimatsu ............... H01L 33/10
                                                         257/95

(Continued)

FOREIGN PATENT DOCUMENTS

| CN | 101213678 A | 7/2008 |
|---|---|---|
| CN | 101859861 A | 10/2010 |

(Continued)

OTHER PUBLICATIONS

Machine translation of CN 104393139.*

(Continued)

*Primary Examiner* — Vincent Wall
(74) *Attorney, Agent, or Firm* — Lee JP Law, P.C.

(57) ABSTRACT

A light-emitting device includes an emission structure, a current block layer on the emission structure, a reflective layer on the current block layer, a protection layer that covers the reflective layer, and an electrode layer on the protection layer.

15 Claims, 14 Drawing Sheets

(51) Int. Cl.
*H01L 33/62* (2010.01)
*H01L 33/38* (2010.01)

(56) References Cited

U.S. PATENT DOCUMENTS

| | | | |
|---|---|---|---|
| 5,821,569 | A | 10/1998 | Dutta |
| 5,861,636 | A | 1/1999 | Dutta et al. |
| 6,372,608 | B1 | 4/2002 | Shimoda et al. |
| 6,645,830 | B2 | 11/2003 | Shimoda et al. |
| RE38,466 | E | 3/2004 | Inoue et al. |
| 6,818,465 | B2 | 11/2004 | Biwa et al. |
| 6,818,530 | B2 | 11/2004 | Shimoda et al. |
| 6,858,081 | B2 | 2/2005 | Biwa et al. |
| 6,967,353 | B2 | 11/2005 | Suzuki et al. |
| 7,002,182 | B2 | 2/2006 | Okuyama et al. |
| 7,084,420 | B2 | 8/2006 | Kim et al. |
| 7,087,932 | B2 | 8/2006 | Okuyama et al. |
| 7,154,124 | B2 | 12/2006 | Han et al. |
| 7,208,725 | B2 | 4/2007 | Sherrer et al. |
| 7,288,758 | B2 | 10/2007 | Sherrer et al. |
| 7,291,865 | B2 | 11/2007 | Kojima et al. |
| 7,319,044 | B2 | 1/2008 | Han et al. |
| 7,501,656 | B2 | 3/2009 | Han et al. |
| 7,709,857 | B2 | 5/2010 | Kim et al. |
| 7,759,140 | B2 * | 7/2010 | Lee ............ H01L 33/22 257/103 |
| 7,781,727 | B2 | 8/2010 | Sherrer et al. |
| 7,790,482 | B2 | 9/2010 | Han et al. |
| 7,940,350 | B2 | 5/2011 | Jeong |
| 7,959,312 | B2 | 6/2011 | Yoo et al. |
| 7,964,881 | B2 | 6/2011 | Choi et al. |
| 7,985,976 | B2 | 7/2011 | Choi et al. |
| 7,994,525 | B2 | 8/2011 | Lee et al. |
| 8,008,683 | B2 | 8/2011 | Choi et al. |
| 8,013,352 | B2 | 9/2011 | Lee et al. |
| 8,049,161 | B2 | 11/2011 | Sherrer et al. |
| 8,129,711 | B2 | 3/2012 | Kang et al. |
| 8,179,938 | B2 | 5/2012 | Kim |
| 8,263,987 | B2 | 9/2012 | Choi et al. |
| 8,324,646 | B2 | 12/2012 | Lee et al. |
| 8,399,944 | B2 | 3/2013 | Kwak et al. |
| 8,432,511 | B2 | 4/2013 | Jeong |
| 8,459,832 | B2 | 6/2013 | Kim |
| 8,502,242 | B2 | 8/2013 | Kim |
| 8,536,604 | B2 | 9/2013 | Kwak et al. |
| 8,546,831 | B1 | 10/2013 | Chen et al. |
| 8,735,931 | B2 | 5/2014 | Han et al. |
| 8,766,295 | B2 | 7/2014 | Kim |
| 8,823,031 | B2 | 9/2014 | Kususe et al. |
| 9,012,952 | B2 * | 4/2015 | Seo ............ H01L 33/20 257/99 |
| 9,300,114 | B2 | 3/2016 | Shimizu et al. |
| 10,121,939 | B2 | 11/2018 | Yang et al. |
| 2005/0247949 | A1 | 11/2005 | Senda et al. |
| 2006/0054921 | A1 | 3/2006 | Murakami et al. |
| 2011/0241045 | A1 * | 10/2011 | Ye ............ H01L 33/20 257/98 |
| 2011/0316026 | A1 | 12/2011 | Kim et al. |
| 2012/0018765 | A1 * | 1/2012 | Mizogami ............ H01L 33/42 257/99 |
| 2012/0208308 | A1 | 8/2012 | Suzuki |
| 2012/0251039 | A1 * | 10/2012 | Shimizu ............ H01S 5/18311 385/14 |
| 2013/0113012 | A1 | 5/2013 | Shinohara et al. |
| 2014/0183590 | A1 | 7/2014 | Kim et al. |
| 2014/0203318 | A1 | 7/2014 | Matsui et al. |
| 2014/0225139 | A1 | 8/2014 | Park et al. |
| 2015/0021565 | A1 * | 1/2015 | Min ............ H01L 51/5256 257/40 |
| 2015/0053995 | A1 | 2/2015 | Bae et al. |
| 2015/0060879 | A1 | 3/2015 | Zheng et al. |
| 2015/0076547 | A1 * | 3/2015 | Totani ............ H01L 33/145 257/98 |
| 2015/0115276 | A1 | 4/2015 | Kuo |
| 2016/0087157 | A1 | 3/2016 | Hsu et al. |
| 2016/0181477 | A1 | 6/2016 | Lee et al. |
| 2016/0218244 | A1 * | 7/2016 | Shin ............ H01L 33/42 |
| 2017/0084784 | A1 | 3/2017 | Goshonoo |
| 2017/0114979 | A1 * | 4/2017 | Kang ............ F21V 5/04 |
| 2017/0263816 | A1 | 9/2017 | Yang et al. |

FOREIGN PATENT DOCUMENTS

| | | |
|---|---|---|
| CN | 101969092 A | 2/2011 |
| CN | 104037295 A | 9/2014 |
| CN | 104319333 A | 1/2015 |
| CN | 204118110 U | 1/2015 |
| CN | 104393139 A | 3/2015 |
| JP | 2006-108161 A | 4/2006 |
| JP | 2012-124321 A | 6/2012 |
| JP | 2013-529846 A | 7/2013 |
| KR | 10-2012-0014341 A | 2/2012 |
| KR | 10-2012-0135818 A | 12/2012 |
| KR | 10-2013-0067149 A | 6/2013 |
| KR | 10-1537330 B1 | 7/2015 |
| WO | WO 2006-082687 A1 | 8/2006 |

OTHER PUBLICATIONS

MOSIS Scalable CMOS (SCMOS), https://www.mosis.com/files/scmos/scmos.pdf, pp. 1-54, May 11, 2009 (Year: 2009).*
Chinese Office action (1st) dated Dec. 5, 2018 for corresponding Chinese application, CN 201710139648.0.
U.S. Office action dated Sep. 21, 2018 to U.S. Appl. No. 15/973,682 (division).
U.S. Office action dated Jul. 29, 2019 to U.S. Appl. No. 15/973,682 (division).
Translation of Chinese Office action (1st) dated Dec. 5, 2018 for corresponding Chinese application, CN 201710139648.0. (all references and Office action previously cited).
Translation of Chinese Office action (2nd) dated Aug. 2, 2019 for corresponding Chinese application, CN 201710139648.0. (all references and Office action previously cited).
USPTO Final Rejection dated Dec. 17, 2019 to U.S. Appl. No. 15/973,682 (continuation).
USPTO Rejection dated May 13, 2020 to U.S. Appl. No. 15/973,682 (Continuation).
USPTO Final Rejection dated Sep. 14, 2020 to U.S. Appl. No. 15/973,682 (Continuation).
Chinese Office action (4th) dated Nov. 3, 2020 for corresponding application CN 201710139648.0.

* cited by examiner

US 10,930,817 B2

1
LIGHT-EMITTING DEVICE

CROSS-REFERENCE TO RELATED APPLICATION

Korean Patent Application No. 10-2016-0029665, filed on Mar. 11, 2016, in the Korean Intellectual Property Office, and entitled: "Light-Emitting Diode (LED) Device for Improving Current Spread Characteristics and Light Extraction Efficiency," is incorporated by reference herein in its entirety.

BACKGROUND

1. Field

Embodiments relate to a light-emitting diode (LED) device, and more particularly, to an LED device for improving current spread characteristics and light extraction efficiency.

2. Description of the Related Art

LED devices may be widely used as a light source due to their low power consumption and high brightness, etc. LED devices need to have high emission reliability. In order to realize high brightness and excellent light-emitting efficiency, current spread characteristics and light extraction efficiency of the LED devices have to be improved.

SUMMARY

One or more embodiments provides a light-emitting device including an emission structure, a current block layer on the emission structure, a reflective layer on the current block layer, a protection layer configured to cover the reflective layer, and an electrode layer on the protection layer.

One or more embodiments provides a light-emitting device including an emission structure including a first conductive type semiconductor layer, an active layer, and a second conductive type semiconductor layer, a first current block layer on an area of the emission structure, a first reflective layer on the first current block layer, a first protection layer configured to cover the first reflective layer, a first electrode layer on the first protection layer and electrically connected to the second conductive type semiconductor layer, and a second electrode layer on a remaining area of the emission structure and electrically connected to the first conductive type semiconductor layer.

One or more embodiments provides a light-emitting device including an emission structure including a first conductive type semiconductor layer, an active layer, and a second conductive type semiconductor layer, a first current block layer on an area of the emission structure and including a first contact hole exposing the emission structure, a first reflective layer on the first current block layer and electrically connected to the second conductive type semiconductor layer via the first contact hole, a first protection layer configured to cover the first reflective layer and including a second contact hole exposing the first reflective layer, a first electrode layer on the first protection layer and electrically connected to the second conductive type semiconductor layer, and a second electrode layer on a remaining area of the emission structure and electrically connected to the first conductive type semiconductor layer.

One or more embodiments provides light-emitting device including an emission structure including a first conductive type semiconductor layer, an active layer, and a second conductive type semiconductor layer stacked in a first direc-

2 tion, a current block layer on the emission structure in a first area, a reflective layer on the current block layer, a first electrode layer on the reflective layer and electrically connected to the second conductive type semiconductor layer, and a second electrode layer on a second area, spaced from the first area along a second direction, orthogonal to the first direction, of the emission structure and electrically connected to the first conductive type semiconductor layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
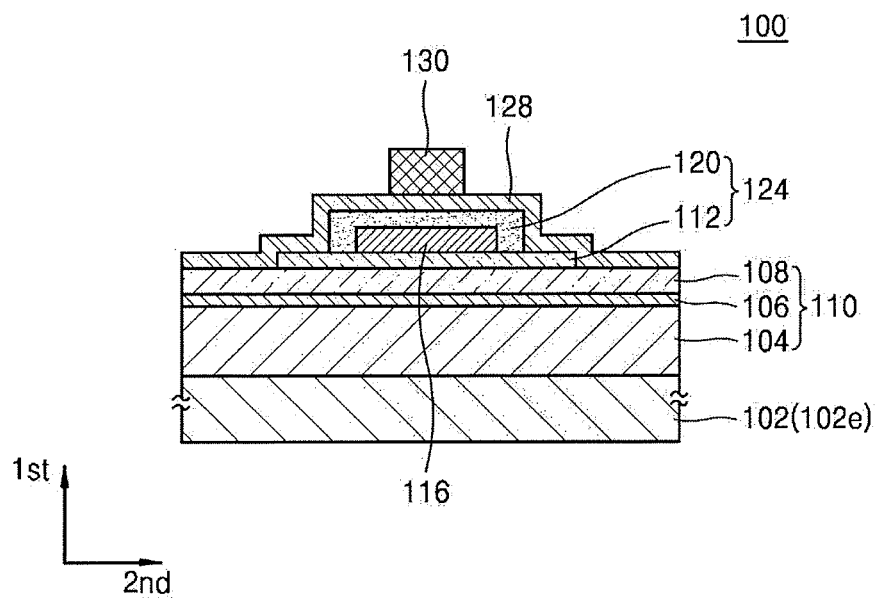
FIG. 1 illustrates a cross-sectional view of a light-emitting device according to an embodiment.

FIG. 1 is a cross-sectional view of a light-emitting device 100 according to an embodiment. In detail, the light-emitting device 100 may include an emission structure 110 including a first conductive type semiconductor layer 104, an active layer 106, and a second conductive type semiconductor layer 108. The emission structure 110 may be on a substrate 102 or a conductive layer 102e.

When the emission structure 110 is on the substrate 102, the light-emitting device 100 may be used as a horizontal type light-emitting device. The substrate 102 may be a growth substrate for growing the emission structure 110. The substrate 102 may be a semiconductor wafer. The substrate 102 may be a silicon-based substrate. The silicon-based substrate may include a silicon (Si) substrate or a silicon carbide (SiC) substrate. When the substrate 102 is the silicon-based substrate, the substrate 102 may be more appropriate for a high aperture and relatively cheap so that productivity is increased. Alternatively, the substrate 102 may be a conductive substrate, for example, a metal substrate.

The substrate 102 may include an insulating substrate including magnesium aluminate ($MgAl_2O_4$), magnesium oxide (MgO), lithium aluminate ($LiAlO_2$), lithium gallium oxide ($LiGaO_2$), gallium nitride (GaN), aluminum nitride (AlN), etc. Sapphire (alpha aluminum oxide ($\alpha$-$Al_2O_3$)) has an electrical insulating property and is a crystal having hexa-rhombo R3c symmetry, wherein lattice constants in a c axis direction and an a axis direction are 13.001 Å and 4.758 Å, respectively. Sapphire may have a C (0001) plane, an A (1120) planee, an R (1102) plane, etc. In this case, it is relatively easy to grow a nitride thin layer on the C surface, and the C surface is stable at a high temperature. Thus, the C surface may be used as a substrate for growing nitride.

The conductive layer 102e may be a conductive material layer including chromium (Cr), titanium (Ti), gold (Au), etc. The conductive layer 102e may apply a current to the first conductive type semiconductor layer 104. Thus, the conductive layer 102e may be used as a first conductive type electrode layer. When the emission structure 110 is on the conductive layer 102e, the light-emitting device 100 may be used as a vertical type light-emitting device.

The first conductive type semiconductor layer 104 included in the emission structure 110 may be an n-type semiconductor layer. The second conductive type semiconductor layer 108 included in the emission structure 110 may be a p-type semiconductor layer. The first conductive type semiconductor layer 104 and the second conductive type semiconductor layer 108 may include a nitride semiconductor, for example, a gallium nitride/indium gallium nitride (GaN/InGaN) material. The first conductive type semiconductor layer 104 and the second conductive type semiconductor layer 108 may include a nitride semiconductor, for example, a material having a composition of $Al_xIn_yGa_{1-x-y}N (0 \leq x \leq 1, 0 \leq y \leq 1, 0 \leq x+y \leq 1)$.

The first conductive type semiconductor layer 104 and the second conductive type semiconductor layer 108 each may include a single layer or a plurality of different layers having different doping concentrations, compositions, etc. The first conductive type semiconductor layer 104 and the second conductive type semiconductor layer 108 may include an aluminum indium gallium phosphate (AlInGaP) or aluminum indium gallium arsenic (AlInGaAs) based semiconductor, in addition to the nitride semiconductor.

The active layer 106 between the first conductive type semiconductor layer 104 and the second conductive type semiconductor layer 108 may emit light due to recombination of electrons and holes. The active layer 106 may have a multi-quantum well (MQW) structure in which a quantum well layer and a quantum barrier layer are alternately stacked. For example, in the case of a nitride semiconductor, the active layer 106 may include a GaN/InGaN structure. The active layer 106 may include a single quantum well (SQW) structure including a nitride semiconductor.

A current block layer 112 may be on the emission structure 110, e.g., may partially cover the second conductive type semiconductor layer 108. The current block layer 112 may increase a current spread characteristic by spreading a current widely in the active layer 106, so that the current is not only applied to the active layer 106 regionally. The current block layer 112 may be an insulating layer. The current block layer 112 may include a silicon dioxide ($SiO_2$) layer, a silicon nitride (SiN) layer, an $Al_2O_3$ layer, and so forth. The current block layer may include a transparent layer which may minimize absorption of light emitted from the emission structure A reflective layer 116 may be on the current block layer 112, e.g., may partially cover the current block layer 112. The reflective layer 116 may include a material for reflecting light emitted from the emission structure 110. The reflective layer 116 may include silver (Ag) or aluminum (Al). The reflective layer 116 may increase light extraction efficiency of the light-emitting device 100.

A protection layer 120 may be on the reflective layer 116 to cover the reflective layer 116. The protection layer 120 may formed on both side surfaces, e.g., may extend from the current block layer 112 along an entirety of both side surfaces of the reflective layer 116 in a first direction to an upper surface thereof, and may cover an upper surface of the reflective layer 116, e.g., may extend in a second direction, opposite the first direction, along an entirety of the upper surface of the reflective layer 116. The protection layer 120 may include an insulating layer, e.g., a $SiO_2$ layer, a SiN layer, and so forth. The protection layer 120 may include a silver oxide (AgO) layer, an $Al_2O_3$ layer, and so forth. Further, the protection layer 120 may include a transparent layer which may minimize absorption of light emitted from the emission structure 110.

When there is no protection layer 120, a migration phenomenon in which particles included in the reflective layer 116 move, or an agglomeration phenomenon in which the particles agglomerate, may occur. Thus, the reliability of the light-emitting device 100 may deteriorate. When there is no protection layer 120, a transparent electrode layer 128, to be described later, and the reflective layer 116 may react with each other, and thus, the reflectivity of the reflective layer 116 may deteriorate or the reliability of the light-emitting device 100 may decrease. When there is no protection layer 120, adhesion between the transparent electrode layer 128 and the reflective layer 116 may be low and thus, the reliability of the light-emitting device 100 may decrease.

The current block layer 112 and the protection layer 120 may serve as an encapsulation layer 124 surrounding the reflective layer 116. Due to the encapsulation layer 124 surrounding the reflective layer 116, light emitted from the emission structure 110 is reflected efficiently from the reflective layer 116 thereby increasing the light extraction efficiency.

Further, the overall structure including the current block layer 112, the reflective layer 116, and the protection layer 120 may increase the current spread characteristic by making currents applied widely over the active layer 106, rather than regionally.

The transparent electrode layer 128 may be on the protection layer 120, the current block layer 112, and the emission structure 110, e.g., the transparent electrode layer 128 may cover an upper surface and side surfaces of the protection layer 120, a portion of an upper surface of the current block layer 112 exposed by the protection layer 120 and side surfaces of the current block layer 112, and an upper surface of the second conductive type semiconductor layer 108 exposed by the current block layer 112. The transparent electrode layer 128 may increase the current spread characteristic such that currents are applied widely, not regionally in the active layer 106.

FIG. 1 illustrates the transparent electrode layer 128. However, the transparent electrode layer 128 may or may not be included in the light-emitting device 100. When the transparent electrode layer 128 is not included in the light-emitting device 100, an electrode layer 130 to be described later may be electrically connected to the second conductive type semiconductor layer 108 via wiring.

Also, FIG. 1 illustrates that the transparent electrode layer 128 is generally on the protection layer 120, the current block layer 112, and the emission structure 110. However, the transparent electrode layer 128 may be only partially on the protection layer 120, the current block layer 112, and the emission structure 110.

The transparent electrode layer 128 may include a material through which light emitted from the emission structure 110 may penetrate. The transparent electrode layer 128 may include indium tin oxide (ITO), indium oxide (IO), tin dioxide (SnO$_2$), zinc oxide (ZnO), or indium zinc oxide (IZO).

As described above, since the reflective layer 116 s protected by the current block layer 12 and the protection layer 120, an adhesion issue between the transparent electrode layer 128 and the reflective layer 116 and deterioration of the reflectivity of the reflective layer 116 may be reduced or prevented.

The electrode layer 130 may be on the transparent electrode layer 128 on the reflective layer 116. The electrode layer 130 may include a conductive material. The electrode layer 130 may include a material which doesn't react with the transparent electrode layer 128. The electrode layer 130 may include chromium (Cr), titanium (Ti), Al, Au, or copper (Cu).

The electrode layer 130 may be on a portion of the transparent electrode layer 128. The electrode layer 130 applies currents to the second conductive type semiconductor layer 108 via the transparent electrode layer 128, and thus, the electrode layer 130 may be the first electrode layer. The electrode layer 130 may be smaller than the reflective layer 116, e.g., shorter in the second direction such that the electrode layer 130 does not completely overlap the reflective layer 116-1 in the first direction, so that light emitted from the emission structure 110 is reflected from the reflective layer 116.

As shown above, the light-emitting device 100 includes the reflective layer 116 and the protection layer 120 on the emission structure 110, thereby improving the light extraction efficiency. Also, the light-emitting device 100 includes the current block layer 112 or the transparent electrode layer 128 on the emission structure, thereby improving the current spread characteristic.

Figure 2:
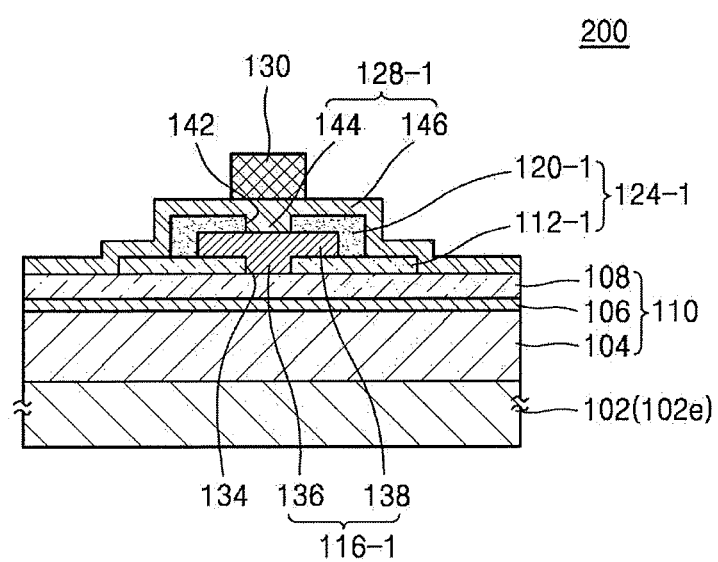
FIG. 2 illustrates a cross-sectional view of a light-emitting device according to an embodiment.

FIG. 2 is a cross-sectional view of a light-emitting device 200 according to an embodiment. In detail, the light-emitting device 200 may be the same as the light-emitting device 100 of FIG. 1 in terms of components and effects, except that the light-emitting device 200 includes a reflective layer 116-1 electrically connected to the second conductive type semiconductor layer 108. Thus, the same components may be omitted from the description or may be only briefly described.

The light-emitting device 200 may include the emission structure 110 on the substrate 102 or the conductive layer 102e. The emission structure 110 may include the first conductive type semiconductor layer 104, the active layer 106, and the second conductive type semiconductor layer 108, as described above.

A current block layer 112-1 including a first contact hole 134 may be on the emission structure 110. The current block layer 112-1 may correspond to the current block layer 112 of FIG. 1, and may include the same function and material as the current block layer 112. The first contact hole 134 may expose a portion of the second conductive type semiconductor layer 108.

The reflective layer 116-1 electrically connected to the second conductive type semiconductor layer 108 via the first contact hole 134 may be on the current block layer 112-1. The reflective layer 116-1 may include a first reflective plug 136 in the first contact hole 134, and a first reflective plate 138 connected to the first reflective plug 136 and on the current block layer 112-1.

The reflective layer 116-1 is electrically connected to the second conductive type semiconductor layer 108. Thus, the reflective layer 116-1 may serve as an electrode. The reflective layer 116-1 may correspond to the reflective layer 116 of FIG. 1, and may include the same function and material as the reflective layer 116.

A protection layer 120-1 covering the reflective layer 116-1 and having a second contact hole 142 is on the reflective layer 11601. The protection layer 120-1 corresponds to the protection layer 120 of FIG. 1, and may include the same function and material as the protection layer 120. The second contact hole 142 may expose a portion of the reflective layer 116-1, e.g., a portion of a surface of the first reflective plate 138.

The current block layer 112-1 and the protection layer 120-1 may be a first partial encapsulation layer 124-1 surrounding the reflective layer 116 -1 and exposing a portion of a surface of the reflective layer 116-1 via the first contact hole 134 and the second contact hole 142. The first partial encapsulation layer 124-1 may make light emitted from a portion of the emission structure 110 be reflected well from the reflective layer 116-1, thereby increasing the light extraction efficiency.

A transparent electrode layer 128-1 electrically connected to the reflective layer 116-1 via the second contact hole 142 may be on the protection layer 120-1, the reflective layer 116-1, the current block layer 112-1, and the emission structure 110. The transparent electrode layer 128-1 is illustrated in FIG. 2. However, the transparent electrode layer 128-1 may or may not be included in the light-emitting device 200. When the transparent electrode layer 128-1 is not included in the light-emitting device 200, the electrode layer 130 may be electrically connected to the second conductive type semiconductor layer 108 via the reflective layer 116-1. The transparent electrode layer 128-1 may have the same function and material as the transparent electrode layer 128 of FIG. 1.

The transparent electrode layer 128-1 may include a first transparent plug 144 in the second contact hole 142, and a first transparent plate 146 connected to the first transparent plug 144 and on the protection layer 120-1, the current block layer 112-1, and the emission structure 110.

The transparent electrode layer 128-1 may not be on the first transparent plug 144, and may be on a certain position of the first transparent plate 146. For example, the electrode layer 130 may be electrically connected to the first transparent plate 146, and may be electrically connected to the reflective layer 116-1 via the second contact hole 142.

The electrode layer 130 may be on the transparent electrode layer 128-1 on the reflective layer 116-1. The electrode layer 130 may be smaller than the reflective layer 116-1, e.g., shorter in the second direction such that the electrode layer 130 does not completely overlap the reflective layer 116-1 in the first direction, so that light emitted from the emission structure 110 is reflected from the reflective layer 116-1.

Figure 3:
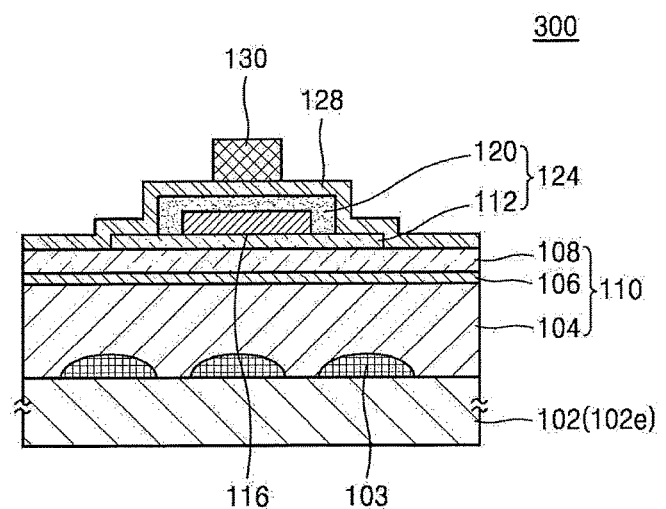
FIG. 3 illustrates a cross-sectional view of a light-emitting device according to an embodiment.

FIG. 3 is a cross-sectional view of a light-emitting device 300 according to an embodiment. In detail, the light-emitting device 300 may be the same as the light-emitting device 100 of FIG. 1 in terms of components and effects, except that the light-emitting device 300 includes a concavo-convex structure 103 on the substrate 102 or the conductive layer 102e. Thus, the same components may be omitted from the description or may be only briefly described.

The light-emitting device 300 may include the substrate 102 or the conductive layer 102e, the emission structure 110, the reflective layer 116, and the encapsulation layer 124 including the current block layer 112 and the protection layer 120. The emission structure 110 may include the first conductive type semiconductor layer 104, the active layer 106, and the second conductive type semiconductor layer 108, as described above.

The light-emitting device 300 may include the concavo-convex structure 103 on a surface of the substrate 102 or the conductive layer 102e. The concavo-convex structure 103 may make light emitted from the emission structure 110 be reflected well, e.g., may focus light onto the reflective layer 116. Accordingly, light extraction efficiency of the light-emitting device 300 may further be increased due to the concavo-convex structure 103.

Figure 4:
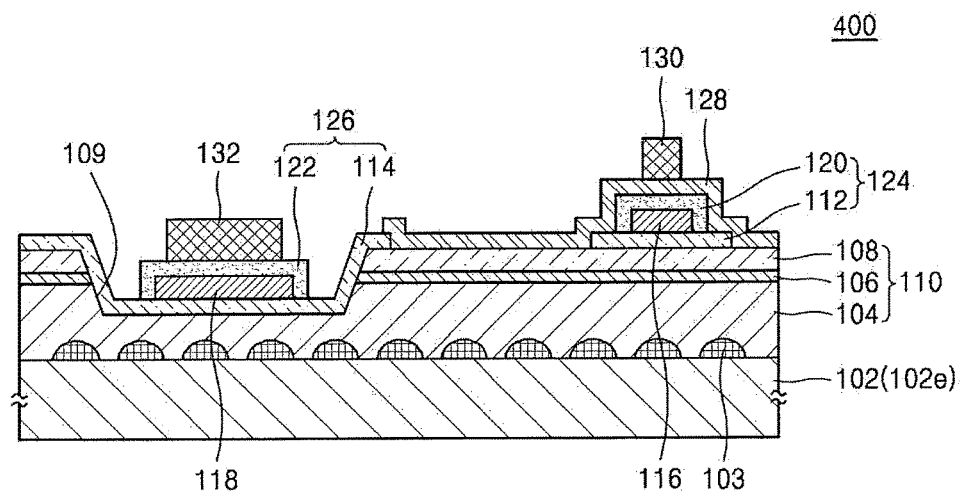
FIGS. 4 and 5 illustrate cross-sectional views of a light-emitting device according to an embodiment.
Figure 5:
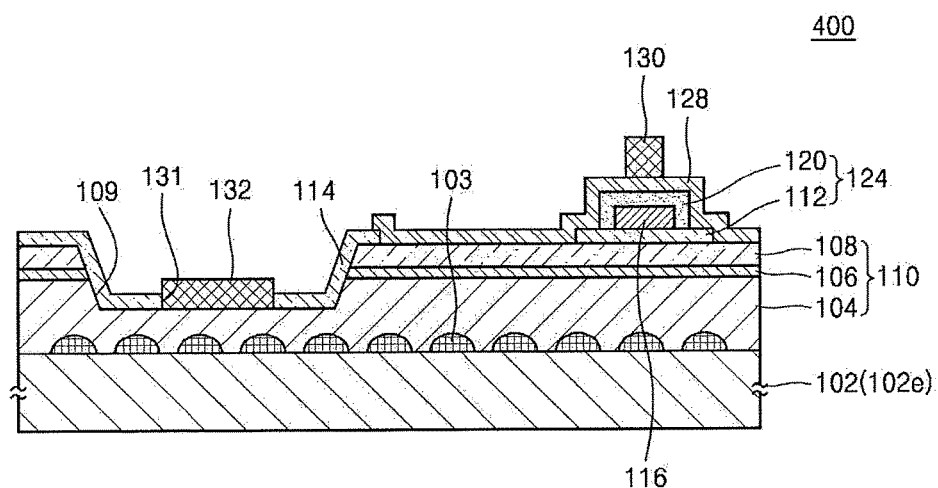

FIGS. 4 and 5 are cross-sectional views of a light-emitting device 400 according to an embodiment. In detail, FIG. 4 illustrates a section of a portion of the light-emitting device 400 and FIG. 5 illustrates a section of the other portion of the light-emitting device 400. The light-emitting device 400 may have various structures according to sectional directions.

The light-emitting device 400 may be the same as the light-emitting devices 100 and 300 of FIGS. 1 and 3 in tern's of components and effects, except that the light-emitting device 400 includes a second electrode layer 132, a second reflective layer 118, and a second encapsulation layer 126 on a portion of the emission structure 110, e.g., spaced apart along the second direction from the stack of the reflective layer 116, the encapsulation layer 124 including the current block layer 112 and the protection layer 120, and the electrode layer 130. Thus, the same components may be omitted from the description or may be only briefly described.

The light-emitting device 400 may include the emission structure 110 on the substrate 102 or the conductive layer 102e. The substrate 102 may be a growth substrate or a conductive substrate as described above. When the light-emitting device 400 includes the emission structure, the second electrode layer 132, and the electrode layer 130 (the first electrode layer) on the substrate 102, the light-emitting device 400 may be used as a horizontal type light-emitting device.

The concavo-convex structure 103 may be on the surface of the substrate 102 or the conductive layer 102e to increase the light extraction efficiency, as illustrated in FIG. 3. The emission structure 110 may include the first conductive type semiconductor layer 104, the active layer 106, and the second conductive type semiconductor layer 108, as described above.

The first current block layer 112 is on a portion of the emission structure 110. The first current block layer 112 may correspond to the current block layer 112 of FIG. 1 and may include the same function and material as the current block layer 112. The reflective layer 116 is on the first current block layer 112. The first reflective layer 116 may correspond to the reflective layer 116 of FIG. 1 and may include the same function and material as the reflective layer 116.

The first protection layer 120 on the first reflective layer 116 may cover the first reflective layer 116. The first protection layer 120 may be on both side surfaces and an upper surface of the first reflective layer 116. The first protection layer 120 may correspond to the protection layer 120 of FIG. 1 and may include the same function and material as the protection layer 120. The first current block layer 112 and the first protection layer 120 may be the encapsulation layer 124 surrounding the first reflective layer 116.

The transparent electrode layer 128 may be on the first protection layer 120, the first current block layer 112, and the second conductive type semiconductor layer 108. The transparent electrode layer 128 may or may not be included in the light-emitting device 400. When the transparent electrode layer 128 is not included in the light-emitting device 400, the first electrode layer 130 may be electrically connected to the second conductive type semiconductor layer 108 via wiring.

The first electrode layer 130 is on the transparent electrode layer 128 on the first reflective layer 116. The first electrode layer 130 may correspond to the electrode layer 130 of FIG. 1 and may include the same function and material as the electrode layer 130 of FIG. 1. The first electrode layer 130 is on the first current block layer 112. The first electrode layer 130 may be electrically connected to the second conductive type semiconductor layer 108 via the transparent electrode layer 128.

A mesa type hole 109 may be on the other portion of the emission structure 110, e.g., spaced apart along the second direction from the stack of the reflective layer 116, the encapsulation layer 124 including the current block layer 112 and the protection layer 120, and the electrode layer 130. The mesa type hole 109 may expose side surfaces of the emission structure 110 and a bottom thereof may expose the first conductive type semiconductor layer 104. The mesa type hole 109 may be formed by partially etching the emission structure 110. The bottom of the mesa type hole 109 may be recessed lower than an upper surface of the first conductive type semiconductor layer 104 along the first direction.

A second current block layer 114 may be on an inner wall of the mesa type hole 109 as illustrated in FIGS. 4 and 5. For example, as illustrated in FIG. 4, the second current block layer 114 may cover, e.g., completely cover, the bottom of the mesa type hole 109, may cover, e.g., completely cover, sidewalls of the mesa type hole 109, and may extend along a portion of an upper surface of the emission structure 110, e.g., a portion exposed by the protection layer 120. Alternatively, as illustrated in FIG. 5, the second current block layer 114 may only partially cover the bottom of the mesa type hole 109, but has a contact hole 131 therein to expose the first conductive type semiconductor layer 104.

The second current block layer 114 may have the same function and material as the first current block layer 112. Further, the second current block layer 114 may serve to protect the emission structure 110 including the first conductive type semiconductor layer 104. The second current block layer 114 may be a passivation layer protecting the emission structure 110.

A second reflective layer 118 may be on the second current block layer 112, e.g., may partially cover the second current block layer at the bottom of the mesa type hole 109. The second reflective layer 118 may have the same function and material as the first reflective layer 116. The second reflective layer 118 may reflect light emitted from the other portion of the emission structure 110, thereby increasing the light emitting efficiency.

The second protection layer 122 may cover the second reflective layer 118 the second reflective layer 118. The second protection layer 122 may be on both side surfaces, e.g., may extend from the second current block layer 114 along an entirety of both side surfaces of the second reflective layer 118 in the first direction to an upper surface thereof, and may cover an upper surface of the second reflective layer 118, e.g., may extend in a second direction, opposite the first direction, along an entirety of the upper surface of the reflective layer 118. The second protection layer 122 may include the same function and material as the first protection layer 120. The second protection layer 122 may protect the second reflective layer 118, thereby increasing the reliability of the light-emitting device 400.

The second current block layer 114 and the second protection layer 122 may serve as a second encapsulation layer 126 surrounding the second reflective layer 118. Due to the second encapsulation layer 126 surrounding the second reflective layer 118, light emitted from the other portion of the emission structure 110 may be reflected well from the second reflective layer 118, and thus, the light extraction efficiency may further be improved.

As illustrated in FIG. 4, a second electrode layer 132 may be on the second protection layer 122 on the second reflective layer 118, at the other portion of the emission structure 110. As illustrated in FIG. 5, the contact hole 131 exposing the first conductive type semiconductor layer 104 may be in the second current block layer 114, at the other portion of the emission structure 110. Accordingly, the second electrode layer 132 may be electrically connected to the first conductive type semiconductor layer 104 via the contact hole 131.

The light-emitting device 400 as shown above includes the first reflective layer 116 and the second reflective layer 118, and the first protection layer 120 and the second protection layer 122 at a portion and the other portion of the emission structure 110, thereby increasing the light extraction efficiency. Furthermore, the light-emitting device 400 includes the first current block layer 112 and the second current block layer 114 at a portion and the other portion of the emission structure 110, and includes the transparent electrode layer 128 at a portion of the emission structure 110, thereby increasing the current spread characteristic.

Figure 6:
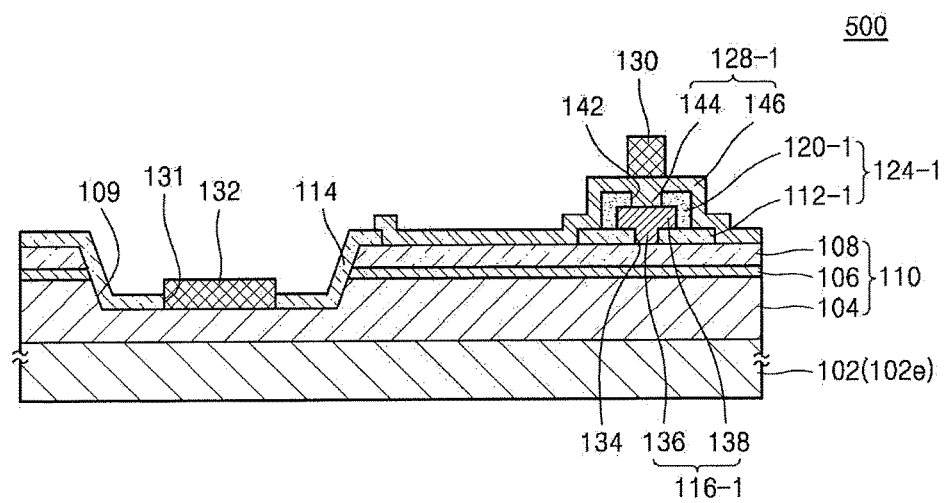
FIG. 6 illustrates a cross-sectional view of a light-emitting device according to an embodiment.

FIG. 6 is a cross-sectional view of a light-emitting device 500 according to an embodiment. In detail, the light-emitting device 500 may be the same as the light-emitting device 400 of FIG. 5 in terms of components and effects, except that the light-emitting device 500 includes the reflective layer 116-1 electrically connected to the second conductive type semiconductor layer 108. The light-emitting device 500 may be the same as the light-emitting device 200 of FIG. 2, since the first current block layer 112-1, the reflective layer 116-1, the first protection layer 120-1, the transparent electrode layer 128-1, and the first electrode layer 130 are on a portion of the emission structure 110. Thus, the same components may be omitted from the description or may be only briefly described.

The light-emitting device 500 may include the emission structure 110 on the substrate 102 or the conductive layer 102e. The emission structure 110 may include the first conductive type semiconductor layer 104, the active layer 106, and the second conductive type semiconductor layer 108, as described above.

The first current block layer 112-1 including the first contact hole 134 may be on a portion of the emission structure 110. The first current block layer 112-1 may have the same function and material as the first current block layer 112 of FIG. 5. The first contact hole 134 may expose a portion of the second conductive type semiconductor layer 108.

The reflective layer 116-1 electrically connected to the second conductive type semiconductor layer 108 via the first contact hole 134 may be on the first current block layer 112-1. The reflective layer 116-1 may include the same function and material as the reflective layer 116 of FIG. 5.

The first reflective layer 116-1 may include the first reflective plug 136 in the first contact hole 134, and the first reflective plate 138 connected to the first reflective plug 136 and on the current block layer 112-1. The first reflective layer 116-1 is electrically connected to the second conductive type semiconductor layer 108, and thus, the first reflective layer 116-1 may serve as an electrode.

The first protection layer 120-1 covering the first reflective layer 116-1 and having the second contact hole 142 is on the first reflective layer 11601. The first protection layer 120-1 and may include the same function and material as the first protection layer 120 of FIG. 5. The second contact hole 142 may expose a portion of the first reflective layer 116-1. The second contact hole 142 may expose a portion of a surface of the first reflective plate 138.

The first current block layer 112-1 and the first protection layer 120-1 may be a first partial encapsulation layer 124-1 surrounding the first reflective layer 116-1 and exposing a portion of a surface of the first reflective layer 116-1 via the first contact hole 134 and the second contact hole 142. The first partial encapsulation layer 124-1 may make light emitted from a portion of the emission structure 110 be reflected well from the first reflective layer 116-1, thereby increasing the light extraction efficiency.

The transparent electrode layer 128-1 electrically connected to the first reflective layer 116-1 via the second contact hole 142 may be on the first protection layer 120-1, the first reflective layer 116-1, the first current block layer 112-1, and the emission structure 110. The transparent electrode layer 128-1 may or may not be included in the light-emitting device 500. The transparent electrode layer 128-1 may have the same function and material as the transparent electrode layer 128 of FIG. 5.

The transparent electrode layer 128-1 may include the first transparent plug 144 in the second contact hole 142, and the first transparent plate 146 connected to the first transparent plug 144 and on the protection layer 120-1, the current block layer 112-1, and the emission structure 110.

The first electrode layer 130 is on the transparent electrode layer 128-1 on the first reflective layer 116-1. The first electrode layer 130 may be formed smaller than the first reflective layer 116-1 so that light emitted from the emission structure 110 is reflected from the first reflective layer 116-1.

The mesa type hole 109 is on the other portion of the emission structure 110. The mesa type hole 109 may expose the first conductive type semiconductor layer 104. The mesa type hole 109 may be formed by partially etching the emission structure 110. The mesa type hole 109 may be recessed lower than a surface of the first conductive type semiconductor layer 104.

The second current block layer 114 may be in an inner wall of the mesa type hole 109, as illustrated in FIG. 6. The second current block layer 114 may have the same function and material as the first current block layer 112-1. The second current block layer 114 may serve to protect the emission structure 110 including the first conductive type semiconductor layer 104. The second current block layer 114 may be a passivation layer protecting the emission structure 110.

The contact hole 131 exposing the first conductive type semiconductor layer 104 may be in the second current block layer 114 at the other portion of the emission structure 110, as illustrated in FIG. 6. Accordingly, the second electrode layer 132 may be electrically connected to the first conductive type semiconductor layer 104 via the contact hole 131.

Figure 7:
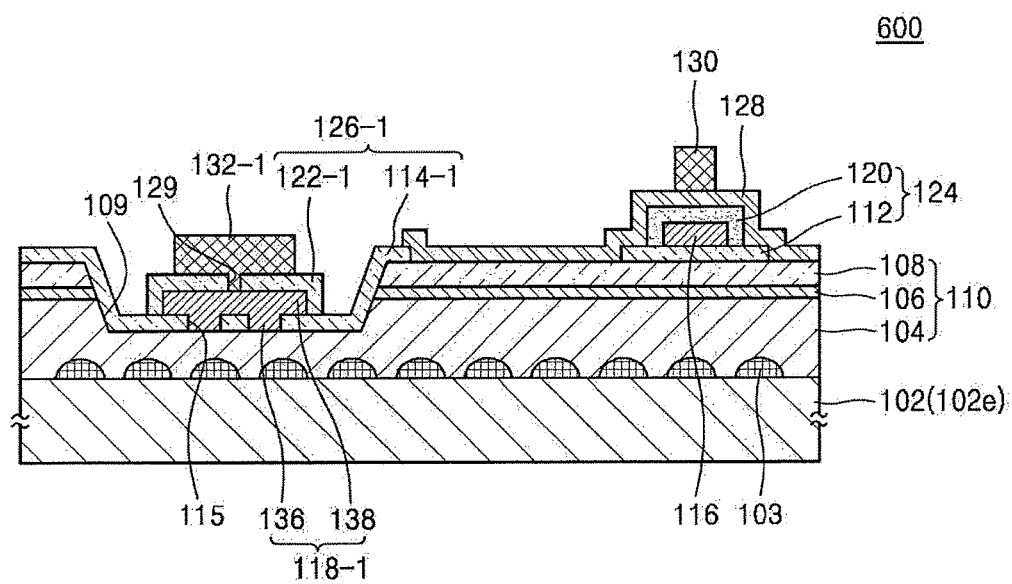
FIG. 7 illustrates a cross-sectional view of a light-emitting device according to an embodiment.

FIG. 7 is a cross-sectional view of a light-emitting device 600 according to an embodiment. In detail, the light-emitting device 600 may be the same as the light-emitting device 400 of FIG. 4 in terms of components and effects, except that the light-emitting device 600 includes a second reflective layer 118-1 electrically connected to the first conductive type semiconductor layer 104. The light-emitting device 600 may be the same as the light-emitting device 100 of FIG. 1, since the first current block layer 112, the first reflective layer 116, the first protection layer 120, the transparent electrode layer 128, and the first electrode layer 130 are on a portion of the emission structure 110. Thus, the same components may be omitted from the description or may be only briefly described.

The light-emitting device 600 may include the emission structure 110 on the substrate 102 or the conductive layer 102e. The emission structure 110 may include the first conductive type semiconductor layer 104, the active layer 106, and the second conductive type semiconductor layer 108, as described above.

The first current block layer 112 is on a portion of the emission structure 110. The first reflective layer 116 is on the first current block layer 112. The first protection layer 120 is on the first reflective layer 116 to cover the first reflective layer 116. The first protection layer 120 may be on both side surfaces and an upper surface of the first reflective layer 116. The first current block layer 112 and the first protection layer 120 may be the first encapsulation layer 124 surrounding the first reflective layer 116.

The transparent electrode layer 128 is on the first protection layer 120, the first current block layer 112, and the second conductive type semiconductor layer 108. The transparent electrode layer 128 may or may not be included in the light-emitting device 600. The first electrode layer 130 is on the transparent electrode layer 128 on the first reflective layer 116. The first electrode layer 130 is on the first current block layer 112. The first electrode layer 130 may be electrically connected to the second conductive type semiconductor layer 108 via the transparent electrode layer 128.

The mesa type hole 109 is on the other portion of the emission structure 110. The mesa type hole 109 may expose the first conductive type semiconductor layer 104. The mesa type hole 109 may be formed by partially etching the emission structure 110. The mesa type hole 109 may be recessed lower than a surface of the first conductive type semiconductor layer 104.

A second current block layer 114-1 may be in an inner wall of the mesa type hole 109 as illustrated in FIG. 7. The second current block layer 114-1 may have the same function and material as the first current block layer 112. The second current block layer 114-1 may serve to protect the emission structure 110 including the first conductive type semiconductor layer 104. The second current block layer 114-1 may be a passivation layer protecting the emission structure 110.

The second reflective layer 118-1 electrically connected to the first conductive type semiconductor layer 104 via the third contact hole 115 on the second current block layer 114-1. The second reflective layer 118-1 may include the first reflective plug 136 in the third contact hole 115, and the first reflective plate 138 connected to the first reflective plug 136 and on the second current block layer 114-1.

The second reflective layer 118-1 is electrically connected to the first conductive type semiconductor layer 104, and thus, the second reflective layer 118-1 may serve as an electrode. The second reflective layer 118-1 may reflect light emitted from the other portion of the emission structure 110, thereby increasing the light extraction efficiency. In addition, the second reflective layer 118-1 may have the same function and material as the first reflective layer 116.

A second protection layer 122-1 covers the second reflective layer 118-1 and has a fourth contact hole 129 exposing the second reflective layer 118-1. The second protection layer 122-1 may have the same function and material as the first protection layer 120.

The second current block layer 114-1 and the second protection layer 122-1 may be a second partial encapsulation layer 126-1 surrounding the second reflective layer 118-1 and exposing a portion of a surface of the second reflective layer 118-1 and the fourth contact hole 129 and a portion of the first conductive type semiconductor layer 104 via the third contact hole 115. The second partial encapsulation layer 126-1 may make light emitted from the other portion of the emission structure 110 be reflected well from the second reflective layer 118-1, thereby increasing the light extraction efficiency.

A second electrode layer 132-1 electrically connected to the fourth contact hole 129 is on the second reflective layer 118-1. The second electrode layer 132-1 may be formed smaller than the second reflective layer 118-1 so that light emitted from the emission structure 110 is reflected from the second reflective layer 118-1.

Figure 8:
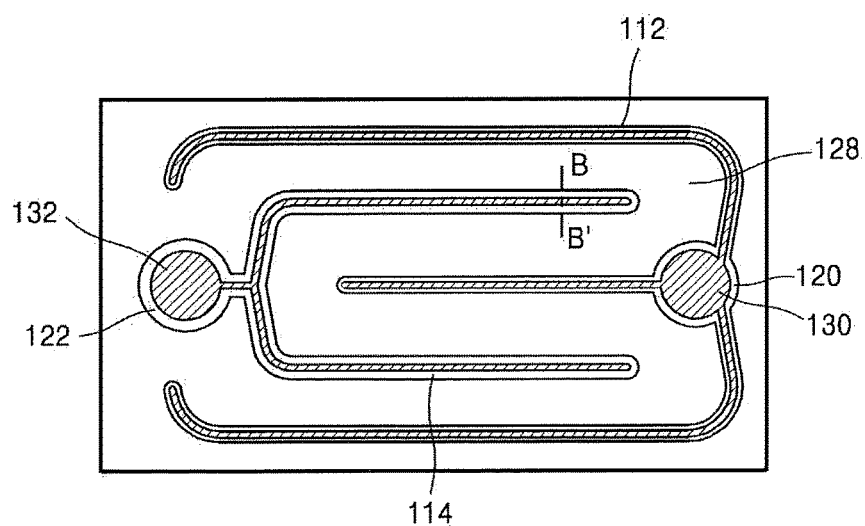
FIG. 8 illustrates a plan view of a light-emitting device according to an embodiment.

FIG. 8 is a plan view of a light-emitting device according to an embodiment. FIGS. 9 through 15 are cross-sectional views for describing stages in a method of manufacturing the light-emitting device 400 of FIGS. 4 and 5. In detail, in FIGS. 9 through 15, the same or substantially the same components as FIGS. 4 and 5 will not be described or will be only briefly described. FIG. 15 is a cross-sectional view taken along a line B-B' of FIG. 8. FIGS. 9 through 15 are views for describing the light-emitting device 400 realized on the substrate 102.

Figure 9:
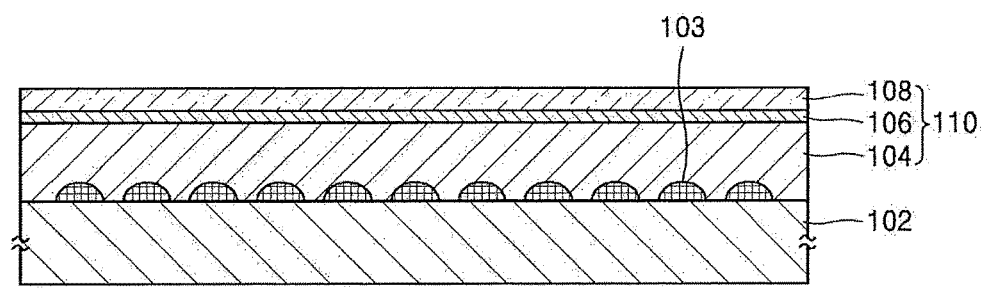
FIGS. 9 through 15 illustrate cross-sectional views for describing stages in a method of manufacturing the light-emitting device of FIGS. 4 and 5.

Referring to FIG. 9, the emission structure 110 including the first conductive type semiconductor layer 104, the active layer 106, and the second conductive type semiconductor layer 108 is formed on the substrate 102. The substrate 102 may be a growth substrate for growing the emission structure 110, for example, a sapphire substrate. The concavo-convex structure 103 may be formed on a surface of the substrate 102.

The first conductive type semiconductor layer 104 may be an n-type semiconductor layer. The second conductive type semiconductor layer 108 may be a p-type semiconductor layer. The first conductive type semiconductor layer 104 and the second conductive type semiconductor layer 108 may include a nitride semiconductor, as described above. The first conductive type semiconductor layer 104 and the second conductive type semiconductor layer 108 may include an AlInGaP or AlInGaAs-based semiconductor, in addition to a nitride semiconductor.

The active layer 106 may include an MQW structure in which a quantum well layer and a quantum barrier layer are alternately stacked. For example, in the case of a nitride semiconductor, the active layer 106 may include a GaN/InGaN structure. The active layer 106 may include an SQW structure including a nitride semiconductor.

Figure 10:
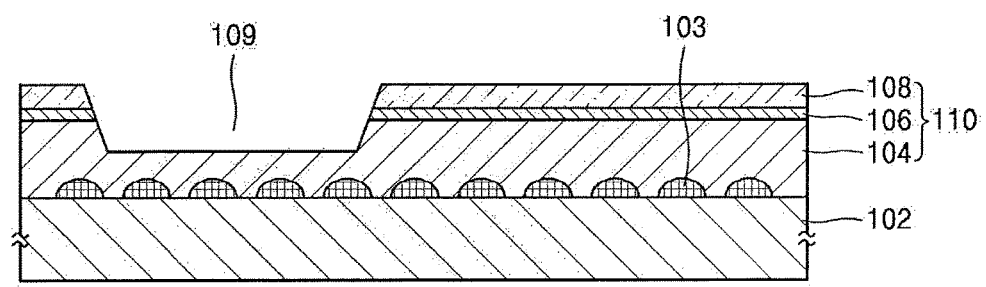

Referring to FIG. 10, the mesa type hole 109 may be formed by selectively etching a portion of the emission structure 110. The mesa type hole 109 is formed to expose the first conductive type semiconductor layer 104 and sides of the remaining emission structure 110. A bottom of the mesa type hole 109 may be recessed lower than an upper surface of the unexposed first conductive type semiconductor layer 104.

Figure 11:
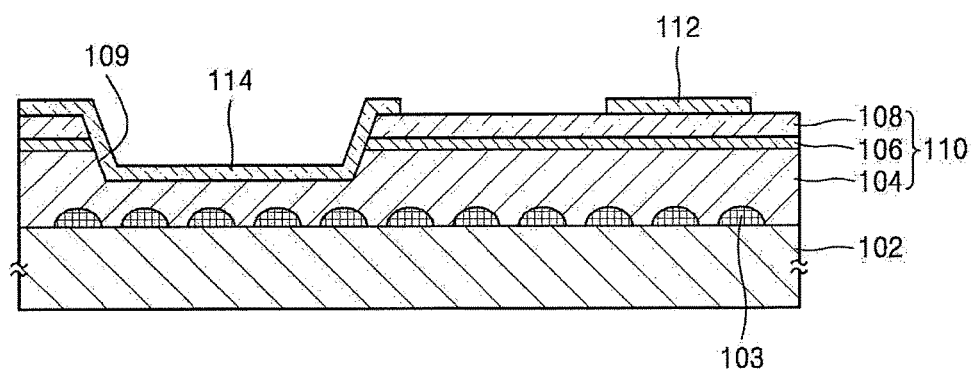

Referring to FIG. 11, the first current block layer 112 is formed on a portion of the emission structure 110. The first current block layer 112 is formed on a portion of the second conductive type semiconductor layer 108. The second current block layer 114 is formed on the other portion of the emission structure 110 in an inner wall of the mesa type hole 109, e.g., on an exposed portion of the first conductive type semiconductor layer 104 and sides of the remaining emission structure 110. The first current block layer 112 and the second current block layer 114 may be simultaneously formed or may be separately formed. The second current block layer 114 may partially extend from the mesa type hole 109 on one or both sides thereof along the second direction on the emission structure 110.

The first current block layer 112 and the second current block layer 114 may improve the current spread characteristic by making currents be not applied regionally in the active layer 106 but be spread widely in the active layer 106. The first current block layer 112 and the second current block layer 114 may be insulating layers. The second current block layer 114 may serve to protect the emission structure 110. Accordingly, the second current block layer 114 may be a passivation layer protecting the emission structure 110.

The first current block layer 112 and the second current block layer 114 may include a $SiO_2$ layer or a SiN layer. Also, the first current block layer 112 and the second current block layer 114 may be transparent, which may minimize absorption of light emitted from the emission structure 110.

Figure 12:
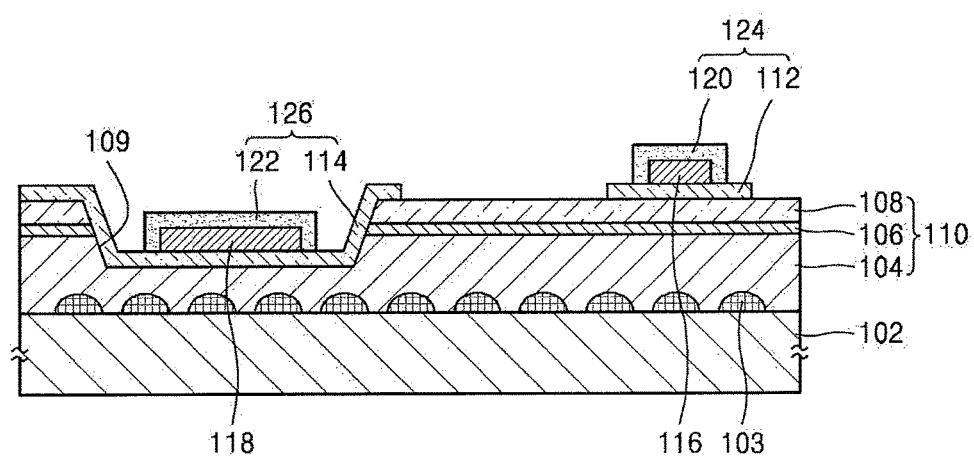

Referring to FIG. 12, the first reflective layer 116 and the second reflective layer 118 are formed on the first current block layer 112 and the second current block layer 114, respectively. The first reflective layer 116 and the second reflective layer 118 may include a material that reflects light emitted from the emission structure 110.

The first reflective layer 116 and the second reflective layer 118 may include Ag or Al. When the first reflective layer 116 and the second reflective layer 118 are included in the light-emitting device, the light extraction efficiency may be improved at a portion and the other portion of the light-emitting device.

Further, the first protection layer 120 and the second protection layer 122 are formed to cover the first reflective layer 116 and the second reflective layer 118, respectively. The first protection layer 120 and the second protection layer 122 are formed on both side surfaces and an upper surface of the first reflective layer 116 and the second reflective layer 118, respectively.

The first protection layer 120 and the second protection layer 122 include insulating layers. The first protection layer 120 and the second protection layer 122 may include an $SiO_2$ layer, an SiN layer, an AgO layer, an $Al_2O_3$ layer, and so forth. Also, the first protection layer 120 and the second protection layer 122 may be transparent, which may minimize absorption of light emitted from the emission structure 110.

When the first protection layer 120 and the second protection layer 122 are not included in the light-emitting device, a migration phenomenon in which particles included in the first reflective layer 116 and the second reflective layer 118 move, or an agglomeration phenomenon in which the particles agglomerate, may occur to deteriorate the reliability of the light-emitting device.

When the first protection layer 120 and the second protection layer 122 are not included in the light-emitting device, the transparent electrode layer 128 and the first reflective layer 116 may react with each other to deteriorate the reflectivity of the first reflective layer 116 or reduce the reliability of the light-emitting device. When the first protection layer 120 and the second protection layer 122 are not included in the light-emitting device, adhesion between the transparent electrode layer 128 and the first reflective layer 116 may be low, and thus, the reliability of the light-emitting device may be reduced.

The first current block layer 112 and the first protection layer 120 may serve as the first encapsulation layer 124 surrounding the first reflective layer 116. The second current block layer 114 and the second protection layer 122 may serve as the second encapsulation layer 126 surrounding the second reflective layer 118. Due to the first encapsulation layer 124 and the second encapsulation layer 126 surrounding the first reflective layer 116 and the second reflective layer 118, respectively, light emitted from the emission structure 110 is reflected well from the first reflective layer 116 and the second reflective layer 118, and thus, the light extraction efficiency may be increased.

Also, the overall structure including the first current block layer 112, the first reflective layer 116, and the first protection layer 120, and the overall structure including the second current block layer 114, the second reflective layer 118, and the second protection layer 122 may make currents be not regionally applied to the active layer 106 but be spread widely in the active layer 106, thereby improving the current spread characteristic.

Figure 13:
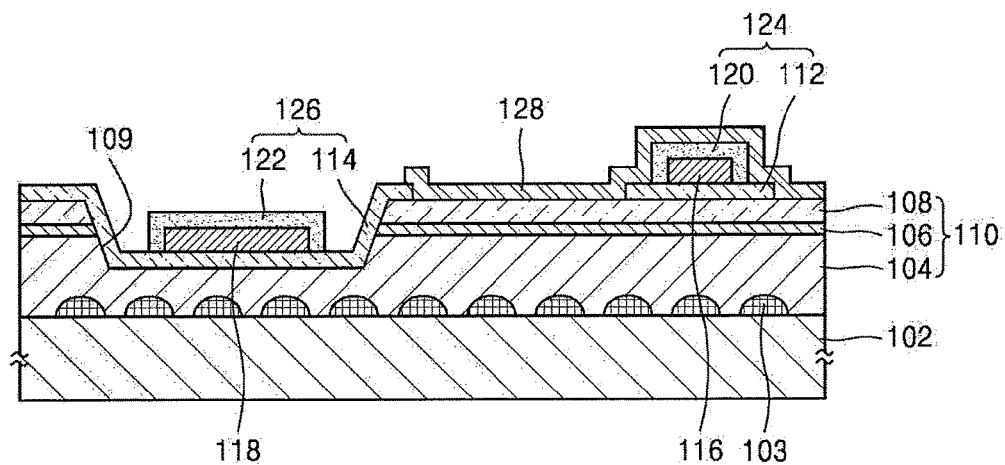

Referring to FIG. 13, the transparent electrode layer 128 is formed on the first protection layer 120, the first current block layer 112, and the emission structure 110. The transparent electrode layer 128 may improve the current spread characteristic by making currents not regionally applied to the active layer 106 but spread widely in the active layer 106. The transparent electrode layer 128 may be optionally formed. The transparent electrode layer 128 may be partially formed on the first protection layer 120, the first current block layer 112, and the emission structure 110.

The transparent electrode layer 128 includes a material through which light emitted from the emission structure 110 penetrates. The transparent electrode layer 128 may include ITO, IO, $SnO_2$, ZnO or IZO.

The first reflective layer 116 is protected by the first current block layer 112 and the first protection layer 120. Thus, an adhesion issue between the transparent electrode layer 128 and the first reflective layer 116 and deterioration of the reflectivity of the first reflective layer 116 may be reduced or eliminated.

Figure 14:
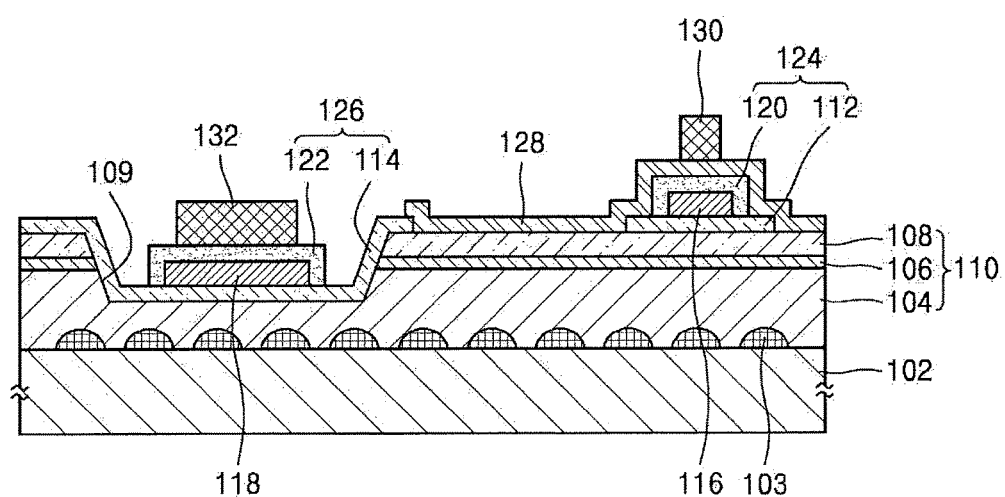
Figure 15:
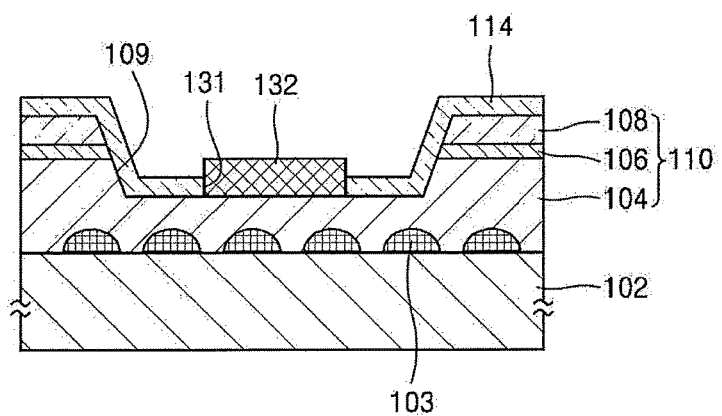

Referring to FIGS. 14 and 15, as illustrated in FIG. 14, the first electrode layer 130 is formed on the transparent electrode layer 128 on the first reflective layer 116. The first electrode layer 130 may apply a current to the second conductive type semiconductor layer 108 via the transparent electrode layer 128. The first electrode layer 130 may be formed on a portion of the transparent electrode layer 128.

As illustrated in FIG. 14, the second electrode layer 132 is formed on the second protection layer 122 on the second reflective layer 118. After the second current block layer 114 is formed as illustrated in FIG. 11, the contact hole 131 exposing the first conductive type semiconductor layer 104 is formed in the second current block layer 114, as illustrated in FIG. 15.

Then, the second electrode layer 132 may be electrically connected to the first conductive type semiconductor layer 104 via the contact hole 131. The first electrode layer 130 may be electrically connected to the second conductive type semiconductor layer 108 via wiring, as illustrated in FIG. 8. Reference numerals 124 and 126 in FIG. 8 indicate encapsulation layer, i.e., insulating layer. The second electrode layer 132 and the first electrode layer 130 may include a conductive material. The second electrode layer 132 and the first electrode layer 130 may include Cr, Ti, Al, Au, or Cu.

FIGS. 16 through 20 are cross-sectional views for describing stages in a method of manufacturing the light-emitting device 600 of FIG. 7. In detail, in FIGS. 16 through 20, the same components as the components of FIG. 7 will not be described or will be only briefly described. FIGS. 16 through 20 are views for describing the light-emitting device 600 realized on the substrate 102. The manufacturing processes of FIGS. 9 through 11 are performed. Thus, the emission structure 110 including the first conductive type semiconductor layer 104, the active layer 106, and the second conductive type semiconductor layer 108 is formed on the substrate 102. The concavo-convex structure 103 may be formed on a surface of the substrate 102, as needed.

The mesa type hole 109 is formed at a portion of the emission structure 110. The first current block layer 112 is formed on the second conductive type semiconductor layer 108 at a portion of the emission structure 110. The second current block layer 114 is formed in the mesa type hole 109.

Figure 16:
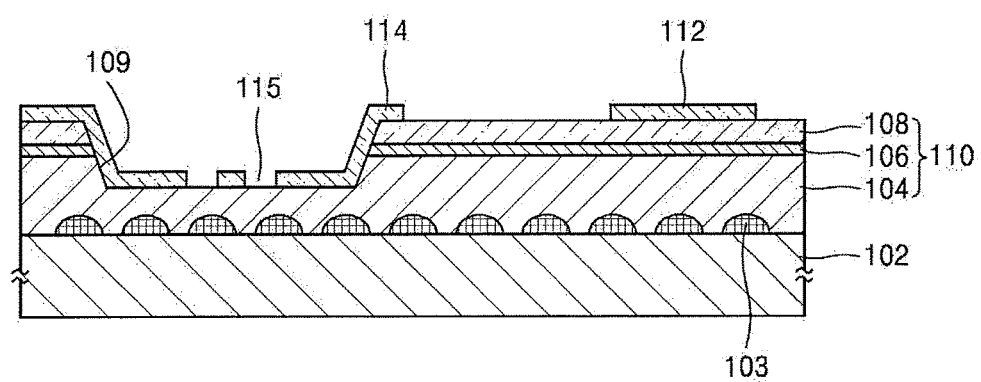
FIGS. 16 through 20 illustrate cross-sectional views for describing stages in a method of manufacturing the light-emitting device of FIG. 7.

Next, the third contact hole 115 is formed in the second current block layer 114 in the mesa type hole 109, as illustrated in FIG. 16. A portion of a surface of the first conductive type semiconductor layer 104 of the emission structure 110 may be exposed via the third contact hole 115.

Figure 17:
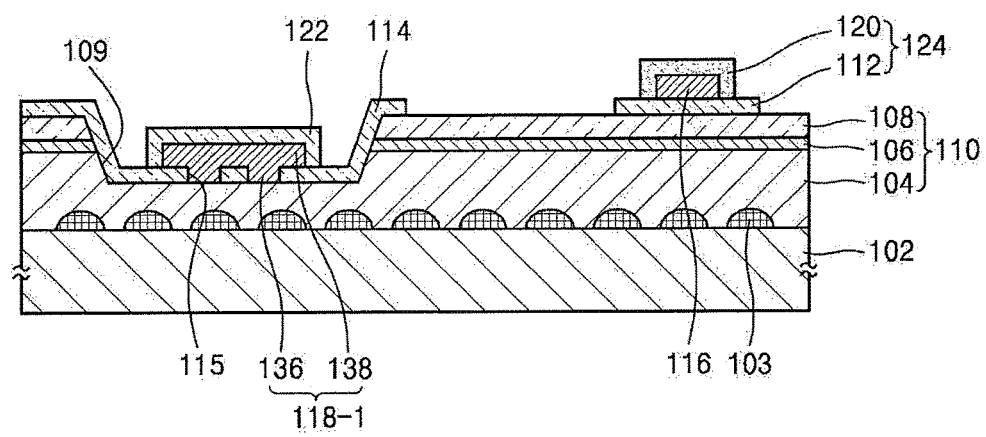

Referring to FIG. 17, the first reflective layer 116 is formed on the first current block layer 112. The second reflective layer 118-1 electrically connected to the first conductive type semiconductor layer 104 via the third contact hole 115 is formed on the second current block layer 114 in the mesa type hole 109.

The second reflective layer 118-1 may include the first reflective plug 136 in the third contact hole 115 and the first reflective plate 138 connected to the first reflective plug 136 and on the second current block layer 114. The second reflective layer 118-1 is electrically connected to the first conductive type semiconductor layer 104, and thus, the second reflective layer 118-1 may serve as an electrode.

The first reflective layer 116 and the second reflective layer 118-1 may be simultaneously formed. The first reflective layer 116 and the second reflective layer 118-1 may be formed by separate processes. Due to the first reflective layer 116 and the second reflective layer 118-1, light emitted from the emission structure 110 may be reflected, and thus, the light extraction efficiency may be improved.

The first protection layer 120 is formed on the first reflective layer 116 to cover the first reflective layer 116. The first protection layer 120 is formed on both side surfaces of an upper surface of the first reflective layer 116. The first current block layer 112 and the first protection layer 120 may be the first encapsulation layer 124 surrounding the first reflective layer 116. The first encapsulation layer 124 may make light emitted from the emission structure 110 be reflected well from the first reflective layer 116, thereby increasing the light extraction efficiency. Further, the second protection layer 122 is formed on the second reflective layer 118-1 to cover the second reflective layer 118-1.

Figure 18:
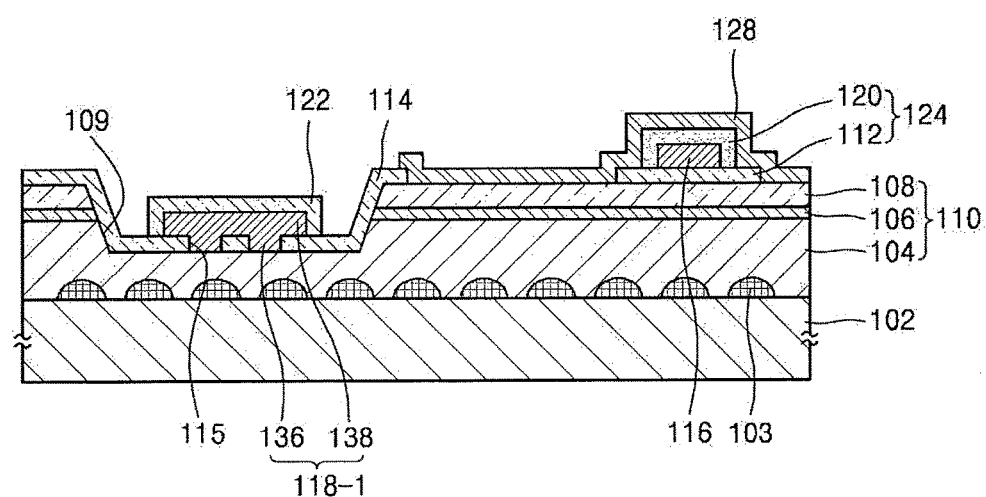
Figure 19:
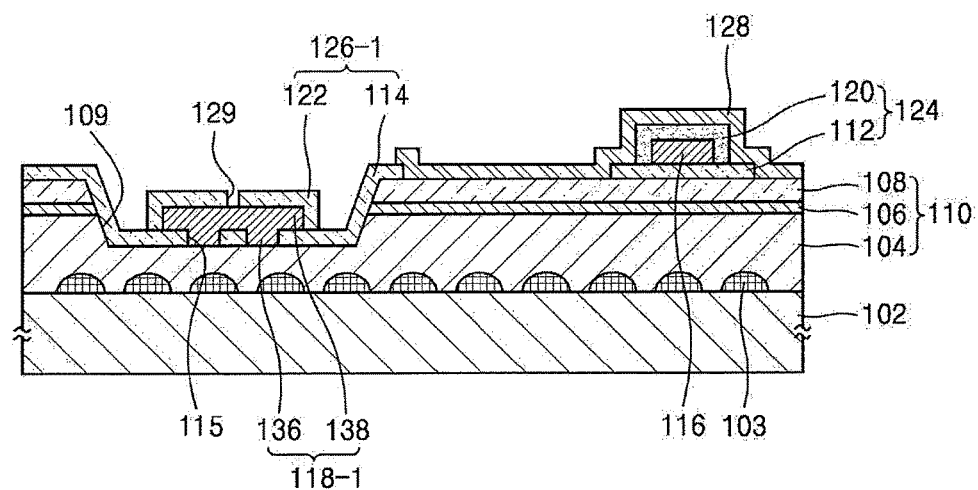

Referring to FIGS. 18 and 19, the transparent electrode layer 128 is formed on the first protection layer 120, the first current block layer 112, and the second conductive type semiconductor layer 108, as illustrated in FIG. 18.

As illustrated in FIG. 19, the fourth contact hole 129 is formed on the second protection layer 122 to expose the second reflective layer 118-1. The fourth contact hole 129 may expose a portion of the second reflective layer 118-1.

The second current block layer 114 and the second protection layer 122 may be the second partial encapsulation layer 126-1 surrounding the second reflective layer 118-1 and exposing a portion of a surface of the second reflective layer 118-1 via the third contact hole 115 and the fourth contact hole 129. The second partial encapsulation layer 126-1 may make light emitted from the other portion of the emission structure 110 be reflected well from the second reflective layer 118-1, thereby increasing the light extraction efficiency.

Figure 20:
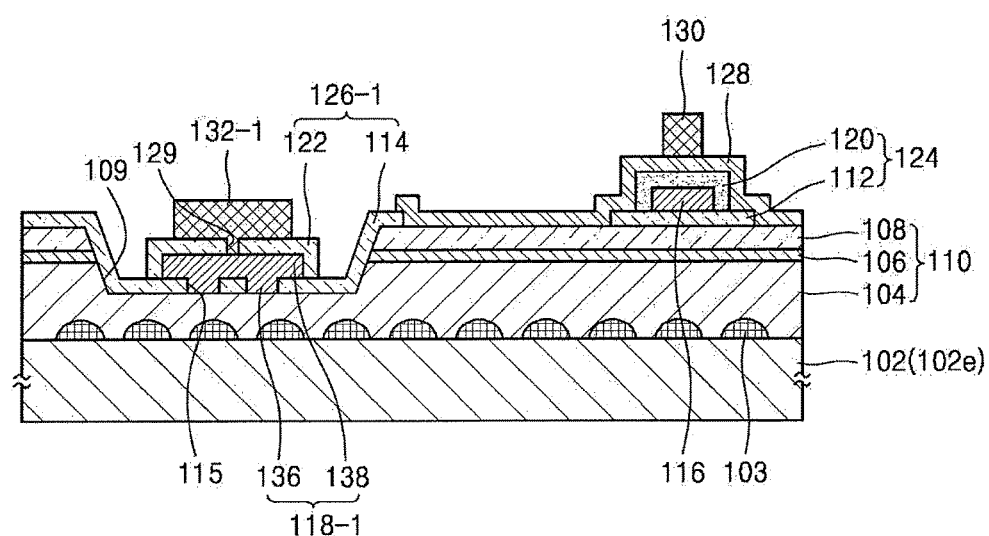

Referring to FIG. 20, the first electrode layer 130 is formed on the transparent electrode layer 128 on the first reflective layer 116. The first electrode layer 130 is formed on the first current block layer 112. The first electrode layer 130 may be electrically connected to the second conductive type semiconductor layer 108 via the transparent electrode layer 128. The first electrode layer 130 may be formed smaller than the first reflective layer 116 so that light emitted from the emission structure 110 is reflected from the first reflective layer 116.

The second electrode layer 132-1 is formed on the second reflective layer 118-1 and the fourth contact hole 129. The second electrode layer 132-1 is electrically connected to the second reflective layer 118-1 via the fourth contact hole 129. The second electrode layer 132-1 is formed smaller than the second reflective layer 118-1 so that light emitted from the emission structure 110 is reflected from the second reflective layer 118-1.

Figure 21:
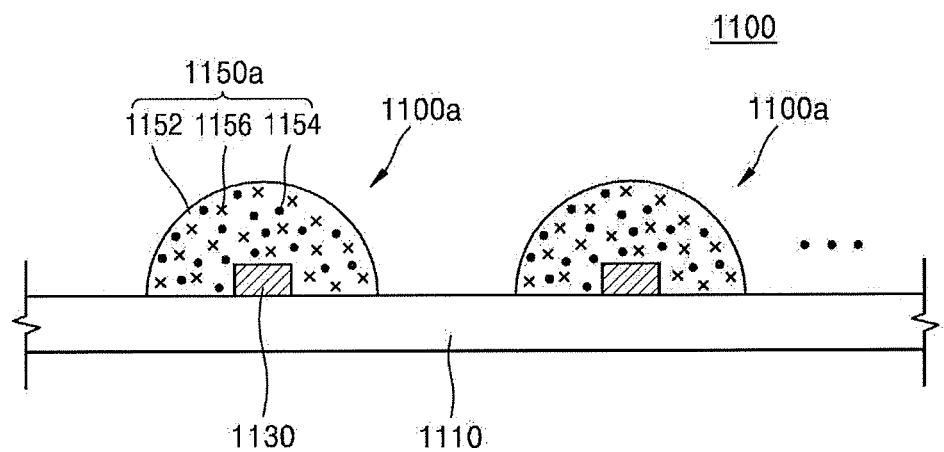
FIGS. 21 and 22 illustrate schematic cross-sectional views of a white light source module including a light-emitting device according to an embodiment.
Figure 22:
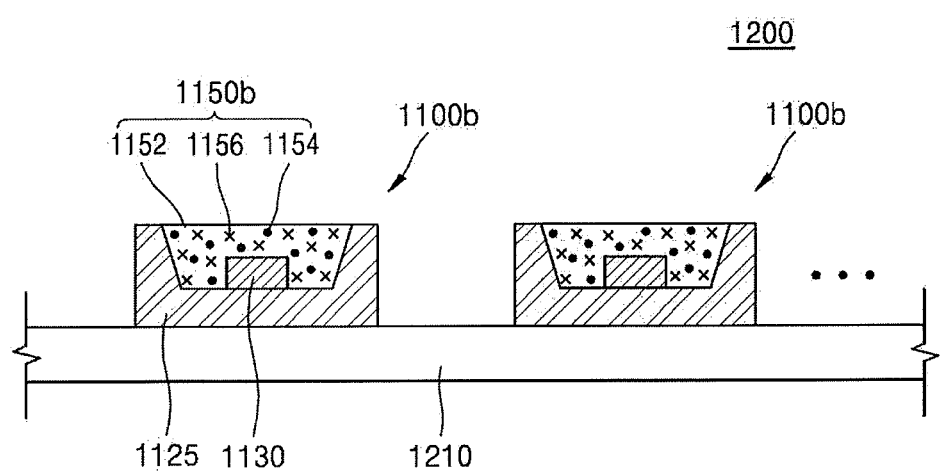

FIGS. 21 and 22 are schematic sectional views of white light source modules 1100 and 1200 including a light-emitting device 1130 according to embodiments.

Referring to FIG. 21, the white light source module 1100 may include a circuit board 1110, and a plurality of white light-emitting devices 1100a mounted on the circuit board 1110. A conductive pattern connected to the white light-emitting devices 1100a may be formed on an upper surface of the circuit board 1110.

Each of the white light-emitting devices 1100a may have a structure in which a light-emitting device 1130 emitting blue light is directly mounted on the circuit board 1110 in a chip-on-board (COB) manner. The light-emitting device 1130 may be at least one of the light-emitting devices 100 through 600 according to the embodiments described above. Each of the white light-emitting devices 1100a may include a wavelength converter 1150a having a semi-spherical shape to function as a lens, and thus can have a wide beam angle. Such a wide beam angle may contribute to reducing a thickness or width of an LCD display.

Referring to FIG. 22, the white light source module 1200 may include a circuit board 1210, and a plurality of white light-emitting devices 1100b mounted on the circuit board 1210. Each of the white light-emitting devices 1100b may include the light-emitting device 1130 that is mounted in a reflective cup of a package body 1125 and emits blue light, and a wavelength converter 1150b encapsulating the light-emitting device 1130. The light-emitting device 1130 may be at least one of the light-emitting devices 100 through 600 according to the embodiments described above.

The wavelength converters 1150a and 1150b may contain wavelength converting materials 1152, 1154, and 1156, e.g., a phosphor and/or a quantum dot, and so forth, as needed. Detailed aspects with respect to the wavelength converting materials 1152, 1154, and 1156 will be described later.

Figure 23A:
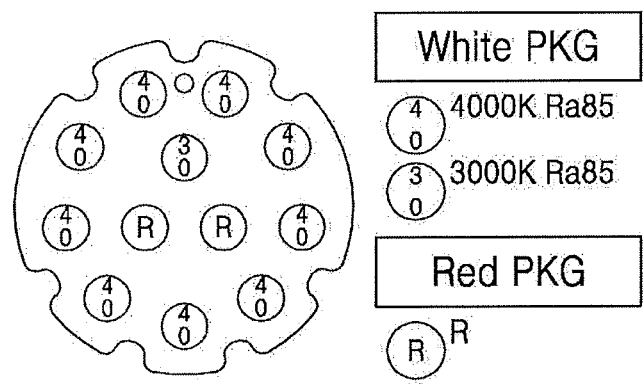
FIGS. 23A and 23B illustrate schematic cross-sectional views of a white light source module applicable to an illumination device, as a light-emitting device, according to an embodiment.
Figure 23B:
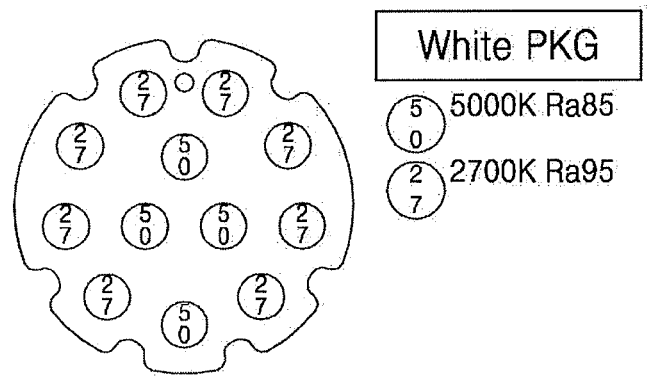
Figure 24:
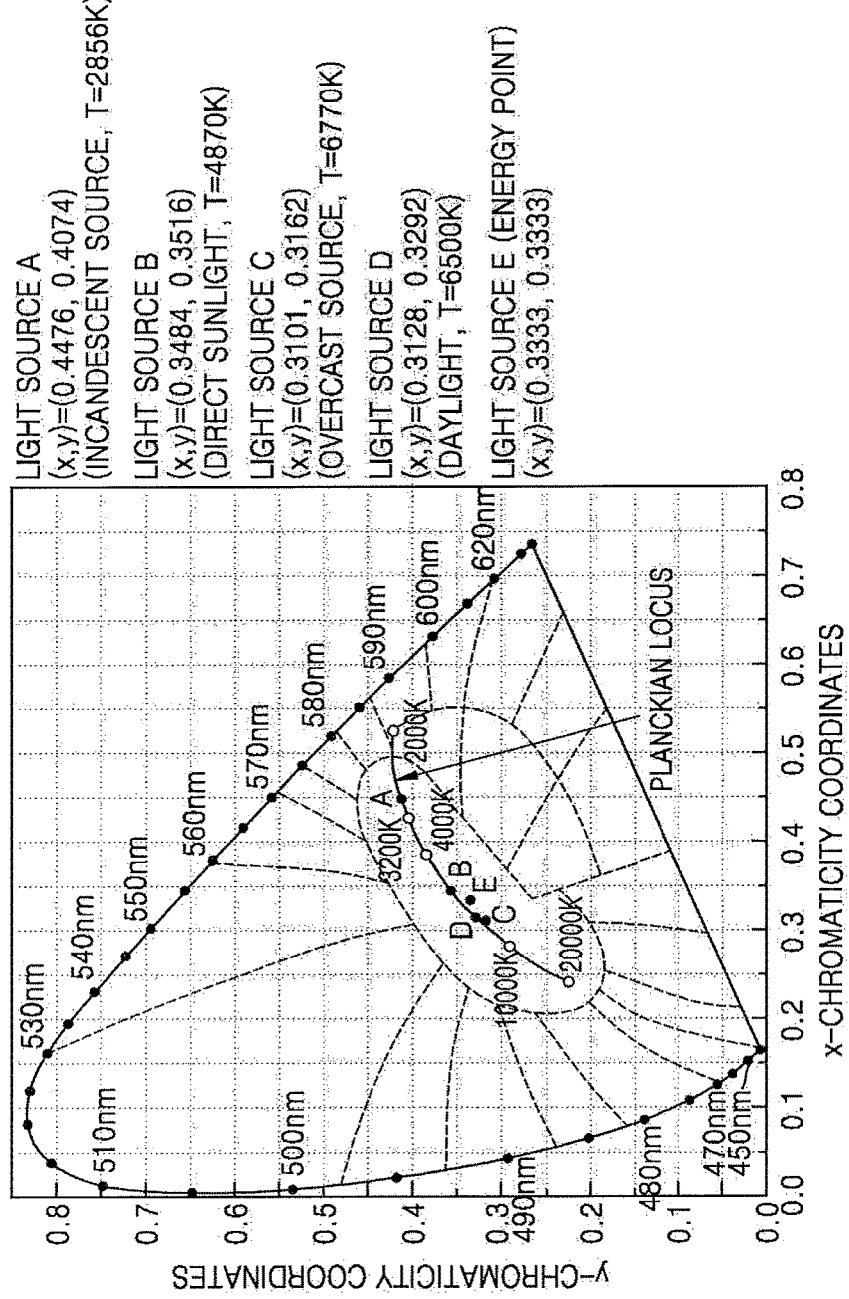
FIG. 24 illustrates a CIE chromaticity diagram showing a perfect radiator spectrum which may be used in a light-emitting device manufactured according to an embodiment.

FIGS. 23A and 23B show schematic cross-sectional views of a white light source module applicable to an illumination device, as a light-emitting device. FIG. 24 is a CIE chromaticity diagram of a perfect radiator spectrum which may be used in a light-emitting device manufactured according to an embodiment.

In detail, each of light source modules shown in FIGS. 23A and 23B may include a plurality of light-emitting device packages 30, 40, RED, 27, and 50 mounted on a circuit board. The plurality of light-emitting device packages 30, 40, RED, 27, and 50 may include at least one of the light-emitting devices 100 through 600 according to the embodiments described above. The plurality of light-emitting device packages 30, 40, RED, 27, and 50 mounted on one light source module may include homogeneous packages generating light of the same wavelengths, or alternatively, as in the present embodiment, may include heterogeneous packages generating light of different wavelengths.

Referring to FIG. 23A, the white light source module may include a combination of white light-emitting device packages 40, 30 respectively having color temperatures of 4000K and 3000K and a red light-emitting device package. The white light source module may be adjusted to a color temperature of 3000K to 4000K, and may provide white light having a color rendering index Ra of 85 to 100.

In another embodiment, the white light source module may include white light-emitting device packages only, and some of the packages may emit white light different color temperatures. For example, as shown in FIG. 23B, a white light-emitting device package 27 having a color temperature of 2700K and a white light-emitting device package 50 having a color temperature of 5000K are combined, thereby providing white light which can be adjusted to a color temperature of 2700K to 5000K and has a color rendering index Ra of 85 to 99. Here, the number of light-emitting device packages having each color temperature may mainly vary with basic set values of color temperatures. For example, in an illumination device having a basic set value of a color temperature of around 4000K, the number of packages corresponding to a color temperature of 4000K may be greater than the number of packages corresponding to a color temperature of 3000K, or the number of red light-emitting device packages.

As such, a heterogeneous light-emitting device package includes an light-emitting device, which emits white light by combining a blue light-emitting device with a yellow, green, red, or orange phosphor, and at least one of violet, blue, green, red, and infrared light-emitting devices, thereby adjusting a color temperature and a color rendering index (CRI) of white light.

In a single light-emitting device package, light of a desired color is determined based on a wavelength of an LED chip, which is a light-emitting device, and a kind and a mixing proportion of a phosphor. In addition, in the case of white light, a color temperature and a color rendering index of the white light may be adjusted.

For example, when an LED chip emits blue light, a light-emitting device package including at least one of yellow, green, and red phosphors may emit white light of various color temperatures according to a mixing proportion of a phosphor. Alternatively, a light-emitting device package, in which a green or red phosphor is applied to a blue LED chip, may emit green or red light. As such, a light-emitting device package emitting white light may be combined with a package emitting green or red light, thereby adjusting a color temperature and a color rendering index of white light. In addition, the light-emitting device package may include at least one of light-emitting devices emitting violet, blue, green, red, and infrared light.

In this case, an illumination device including the light-emitting device package may be adjusted to a color rendering index of a sodium (Na) lamp level to a solar level. In addition, the illumination device may generate various white light spectra having a color temperature of about 1500K to about 20000K, and if necessary, the illumination device can adjust an illumination color according to an ambient atmosphere or mood by generating visible light, which has a violet, blue, green, red, or orange color, or infrared light. Further, the illumination device may generate light of a special wavelength capable of promoting growth of plants.

White light obtained by combining a blue light-emitting device with a yellow, green, or red phosphor and/or a green or red light-emitting device may have two or more peak wavelengths, and may be positioned on a line segment defined by (x, y) coordinates of (0.4476, 0.4074), (0.3484, 0.3516), (0.3101, 0.3162), (0.3128, 0.3292), and (0.3333, 0.3333) in a CIE 1931 coordinate system, as shown in FIG. 21. Alternatively, the white light may be positioned in a region that is surrounded by the line segment and a black body radiation spectrum. A color temperature of the white light may range from 1500K to 20000K. In FIG. 24, white light around the coordinate E (0.3333, 0.3333) at a bottom portion of the black body radiation spectrum (Planckian locus) may have a relatively low yellow-based property, and may be used as an illumination source of a region which may be more vivid and fresher to the naked eye. Thus, illumination products using the white light around the coordinate E (0.3333, 0.3333) at the bottom portion of the black body radiation spectrum (Planckian locus) may be good for shopping mall illumination which sells groceries, clothing, etc.

Various materials such as a phosphor and/or a quantum dot may be used as a material for converting a wavelength of light emitted from a semiconductor light-emitting device.

The phosphor may have the following empirical formulae and colors as follows. Oxide-based phosphor: Yellow and Green yttrium aluminum garnet: cesium $(Y_3Al_5O_{12}:Ce)$, terbium aluminum garnet: cesium $(Tb_3Al_5O_{12}:Ce)$, lutetium aluminum garnet: cesium $(Lu_3Al_5O_{12}:Ce)$ Silicate-based phosphor: Yellow and Green $(Ba,Sr)_2SiO_4:Eu$, Yellow and Orange $(Ba,Sr)3SiO5:Ce$ Nitride-based phosphor: Green$\beta$-SiAlON:Eu, Yellow $La_3Si_6N_{11}$:Ce, Orange $\alpha$-SiAlON:Eu, Red $CaAlSiN_3$:Eu, $Sr_2Si_5N_8$:Eu, $SrSiAl_4N_7$:Eu, $SrLiAl_3N_4$: Eu, $Ln_{4-x}(Eu_zM_{1-z})_xSi_{12-y}Al_y O_{3+x+y}N_{18-x-y}$ ($0.5 \leq x \leq 3$, $0 < z < 0.3$, $0 < y \leq 4$)—Formula (1). (here, Ln may be at least one selected from the group consisting of Group IIIA elements and rare-earth elements, and M may be at least one of Ca, Ba, Sr, and Mg). Fluoride-based phosphor: KSF-based Red $K_2SiF_6:Mn^{4+}$, $K_2TiF_6:Mn^{4+}$, $NaYF_4:Mn^{4+}$, $NaGdF_4:Mn^{4+}$, $K_3SiF_7:Mn^{4+}$.

Composition of the phosphor should accord with stoichiometry, and each element can be substituted with another element in a group of the periodic table, to which the element belongs. For example, Sr can be substituted with Ba, Ca, Mg, or the like of the alkali earth metal group (Group II), and Y can be substituted with Tb, Lu, Sc, Gd, or the like of the lanthanide series. In addition, Eu or the like, which is an activator, can be substituted with Ce, Tb, Pr, Er, Yb, or the like according to a desired energy level. Further, the activator may be used alone, or may be used in conjunction with a sub-activator or the like in order to modify properties of the phosphor.

In particular, the fluoride-based red phosphor may be coated with fluoride, which does not contain Mn, for improvement of reliability at high temperature/high humidity, or may further include an organic coating on a surface of the phosphor or on a fluoride coating surface not containing Mn. Since the fluoride-based red phosphor can realize a narrow full width at half maximum (FWHM) of 40 nm or less unlike other phosphors, the fluoride-based red phosphor can be used for high-resolution TVs such as UHD TVs.

Table 1 shows phosphors according to applications of white light-emitting devices using LED chips (wavelength: 440 nm to 460 nm) or UV LED chips (wavelength: 380 nm to 440 nm).

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, char-

TABLE 1

| Usage | Phosphor | Usage | Phosphor |
|---|---|---|---|
| LED TV BLU | β-SiAlON:$Eu^{2+}$<br>(Ca,Sr)AlSiN$_3$:$Eu^{2+}$<br>La$_3$Si$_6$N$_{11}$:$Ce^{3+}$<br>K$_2$SiF$_6$:$Mn^{4+}$<br>SrLiAl$_3$N$_4$:Eu<br>Ln$_{4-x}$(Eu$_z$M$_{1-z}$)$_x$Si$_{12-y}$Al$_y$O$_{3+x+y}$N$_{18-x-y}$<br>($0.5 \leq x \leq 3, 0 < z < 0.3, 0 < y \leq 4$)<br>K$_2$TiF$_6$:$Mn^{4+}$<br>NaYF$_4$:$Mn^{4+}$<br>NaGdF$_4$:$Mn^{4+}$ | Side View<br>(Mobile, Note PC) | Lu$_3$Al$_5$O$_{12}$:$Ce^{3+}$<br>Ca-α-SiAlON:$Eu^{2+}$<br>La$_3$Si$_6$N$_{11}$:$Ce^{3+}$<br>(Ca,Sr)AlSiN$_3$:$Eu^{2+}$<br>Y$_3$Al$_5$O$_{12}$:$Ce^{3+}$<br>(Sr,Ba,Ca,Mg)$_2$SiO$_4$:$Eu^{2+}$<br>K$_2$SiF$_6$:$Mn^{4+}$<br>SrLiAl$_3$N$_4$:Eu<br>Ln$_{4-x}$(Eu$_z$M$_{1-z}$)$_x$Si$_{12-y}$Al$_y$O$_{3+x+y}$N$_{18-x-y}$<br>($0.5 \leq x \leq 3, 0 < z < 0.3, 0 < y \leq 4$)<br>K$_2$TiF$_6$:$Mn^{4+}$<br>NaYF$_4$:$Mn^{4+}$<br>NaGdF$_4$:$Mn^{4+}$ |
| Illumination | Lu$_3$Al$_5$O$_{12}$:$Ce^{3+}$<br>Ca-α-SiAlON:$Eu^{2+}$<br>La$_3$Si$_6$N$_{11}$:$Ce^{3+}$<br>(Ca,Sr)AlSiN$_3$:$Eu^{2+}$<br>Y$_3$Al$_5$O$_{12}$:$Ce^{3+}$<br>K$_2$SiF$_6$:$Mn^{4+}$<br>SrLiAl$_3$N$_4$:Eu<br>Ln$_{4-x}$(Eu$_z$M$_{1-z}$)$_x$Si$_{12-y}$Al$_y$O$_{3+x+y}$N$_{18-x-y}$<br>($0.5 \leq x \leq 3, 0 < z < 0.3, 0 < y \leq 4$)<br>K$_2$TiF$_6$:$Mn^{4+}$<br>NaYF$_4$:$Mn^{4+}$<br>NaGdF$_4$:$Mn^{4+}$ | Electrical Component<br>(Head Lamp, etc.) | Lu$_3$Al$_5$O$_{12}$:$Ce^{3+}$<br>Ca-α-SiAlON:$Eu^{2+}$<br>La$_3$Si$_6$N$_{11}$:$Ce^{3+}$<br>(Ca,Sr)AlSiN$_3$:$Eu^{2+}$<br>Y$_3$Al$_5$O$_{12}$:$Ce^{3+}$<br>K$_2$SiF$_6$:$Mn^{4+}$<br>SrLiAl$_3$N$_4$:Eu<br>Ln$_{4-x}$(Eu$_z$M$_{1-z}$)$_x$Si$_{12-y}$Al$_y$O$_{3+x+y}$N$_{18-x-y}$<br>($0.5 \leq x \leq 3, 0 < z < 0.3, 0 < y \leq 4$)<br>K$_2$TiF$_6$:$Mn^{4+}$<br>NaYF$_4$:$Mn^{4+}$<br>NaGdF$_4$:$Mn^{4+}$ |

Furthermore, wavelength transformers may include wavelength transforming materials such as QDs, replacing the phosphor or mixed with the phosphor.

Figure 25:
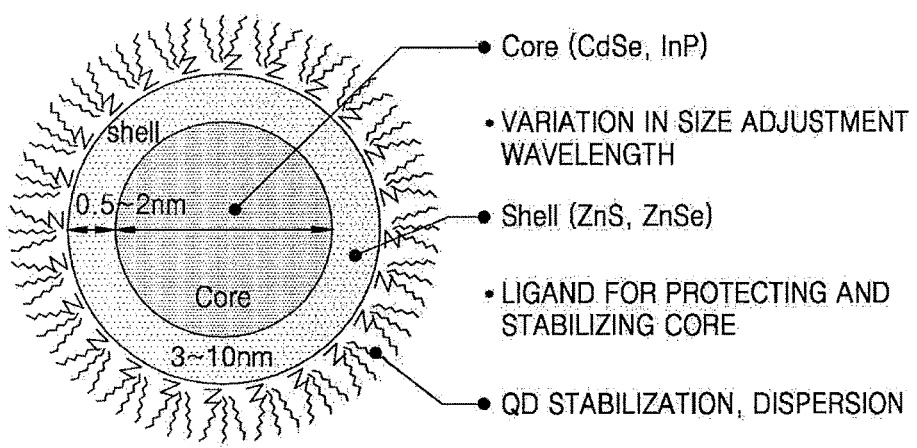
FIG. 25 illustrates a schematic diagram showing a sectional structure of a quantum dot (QD), which is a wavelength converting material which may be used in a light-emitting device according to an embodiment.

FIG. 25 is a schematic diagram showing a sectional structure of a quantum dot (QD) as a wavelength converting material which may be used in a light-emitting device according to an embodiment.

In detail, the quantum dot (QD) may have a core-shell structure using a Group III-V or Group II-VI compound semiconductor. For example, the quantum dot may have a core, e.g., CdSe, InP, or the like, and a shell, e.g., ZnS, ZnSe, or the like. In addition, the quantum dot may include a ligand for stabilizing the core and the shell. For example, the core may have a diameter of 1 nm to 30 nm, specifically 3 nm to 10 nm. The shell may have a thickness of 0.1 nm to 20 nm, specifically 0.5 nm to 2 nm.

The quantum dot can realize various colors according to sizes. In particular, when used as a substitute for a phosphor, the quantum dot can substitute for a red or green phosphor. When used, the quantum dot can realize a narrow full width at half maximum (for example, about 35 nm).

The wavelength converting material may be contained in the encapsulant. Alternatively, the wavelength converting material, which is manufactured in a film shape in advance, may be attached to a surface of an optical structure such as an LED chip or a light guide plate. In this case, the wavelength converting material may be easily applied to a desired region while having a uniform thickness.

By way of summation and review, one or more embodiments may provide a light-emitting diode (LED) device having high emission reliability and being capable of improving a current spread characteristic and light extraction efficiency.

acteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light-emitting device, comprising:

an emission structure, the emission structure including a first conductive type semiconductor layer, an active layer, and a second conductive type semiconductor layer stacked in a first direction;

a current block layer directly on the second conductive type semiconductor layer of the emission structure, the current block layer including a first contact hole;

a reflective layer on the current block layer, the reflective layer being electrically connected to the emission structure via the first contact hole, and wherein a total width of the reflective layer parallel to the emission structure is less than a total width of the current block layer parallel to the emission structure;

a protection layer to cover the reflective layer;

an electrode layer on the protection layer, wherein the total width of the reflective layer parallel to the emission structure is greater than a total width of the electrode layer parallel to the emission structure;

a mesa-type hole adjacent to the emission structure, the mesa-type hole exposing the first conductive type semiconductor layer of the emission structure;

an additional current block layer in the mesa-type hole, the additional current block layer including:
a first portion extending continuously from an upper edge of the mesa-type hole along a sidewall of the mesa-type hole, and a second portion extending continuously from an end of the first portion along a bottom of the mesa-type hole; and
an additional electrode directly contacting the first conductive type semiconductor layer through the second portion of the additional current block layer, the second portion of the additional current block layer directly contacting a lateral side of the additional electrode.

2. The light-emitting device as claimed in claim 1, further comprising a transparent electrode layer which is partially on the protection layer, the current block layer, and the emission structure.

3. The light-emitting device as claimed in claim 1, wherein the additional electrode and the second portion of the additional current block layer are parallel to each other and to the bottom of the mesa-type hole.

4. The light-emitting device as claimed in claim 1, wherein the protection layer is on both side surfaces and an upper surface of the reflective layer.

5. The light-emitting device as claimed in claim 1, further comprising a transparent electrode layer on the protection layer, wherein the protection layer includes a second contact hole, and the transparent electrode layer is electrically connected to the reflective layer via the second contact hole.

6. A light-emitting device, comprising:
an emission structure including a first conductive type semiconductor layer, an active layer, and a second conductive type semiconductor layer stacked in a first direction;
a first current block layer on the emission structure in a first area, the first current block layer including a first contact hole exposing the emission structure;
a first reflective layer on the first current block layer, the first reflective layer extending through the first contact hole to be electrically connected to the second conductive type semiconductor layer;
a first protection layer that covers the first reflective layer and including a second contact hole exposing the first reflective layer;
a first electrode layer on the first protection layer and electrically connected to the second conductive type semiconductor layer;
a second electrode layer on a second area of the emission structure and electrically connected to the first conductive type semiconductor layer, wherein the first and second electrode layers do not overlap along the first direction, and wherein the second electrode layer is in a mesa-type hole exposing the first conductive type semiconductor layer; and
a second current block layer along an inner wall of the mesa-type hole, the second current block layer including a third contact hole exposing the first conductive type semiconductor layer, and the second electrode layer overlapping the third contact hole and directly contacting the second current block layer.

7. The light-emitting device as claimed in claim 6, wherein the first electrode layer is on the first current block layer and the first protection layer is on both side surfaces and an upper surface of the first reflective layer.

8. The light-emitting device as claimed in claim 6, wherein the first current block layer and the first protection layer surround the first reflective layer, and a portion of a surface of the first reflective layer is exposed via the first contact hole and the second contact hole.

9. The light-emitting device as claimed in claim 6, further comprising a transparent electrode layer on the first protection layer and the second conductive type semiconductor layer, wherein the transparent electrode layer is electrically connected to the first reflective layer via the second contact hole, wherein the transparent electrode layer is between the first reflective layer and the first electrode layer.

10. The light-emitting device as claimed in claim 6, wherein the second electrode layer directly contacts the first conductive type semiconductor layer through the third contact hole of the second current block layer, lateral sides of the second electrode layer extending through the third contact hole above the second current block layer.

11. The light-emitting device as claimed in claim 6, wherein the second current block layer extends conformally along an inner wall of the mesa-type hole, the second current block layer being in direct contact with portions of the first conductive type semiconductor layer, the active layer, and the second conductive type semiconductor layer.

12. A light-emitting device, comprising:
an emission structure including a first conductive type semiconductor layer, an active layer, and a second conductive type semiconductor layer stacked in a first direction;
a current block layer on the emission structure in a first area;
a reflective layer on the current block layer;
a first electrode layer on the reflective layer and electrically connected to the second conductive type semiconductor layer;
a transparent electrode layer between the reflective layer and the first electrode layer; and
a second electrode layer on a second area, spaced from the first area along a second direction, orthogonal to the first direction, of the emission structure and electrically connected to the first conductive type semiconductor layer, such that the first and second electrode layers do not overlap along the first direction.

13. The light-emitting device as claimed in claim 12, wherein the reflective layer extends beyond the first electrode layer in the second direction.

14. The light-emitting device as claimed in claim 12, wherein the transparent electrode layer extends along side surfaces of the reflective layer.

15. The light-emitting device as claimed in claim 14, wherein the transparent electrode layer contacts an upper surface of the second conductive type semiconductor layer.

* * * * *